(12) United States Patent
Foo et al.

(10) Patent No.: US 11,805,602 B2
(45) Date of Patent: Oct. 31, 2023

(54) CHIP ASSEMBLIES

(71) Applicant: Intel Corporation, Santa Clara, CA (US)

(72) Inventors: Loke Yip Foo, Pinang (MY); Choong Kooi Chee, Pulau Pinang (MY); Teong Guan Yew, Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 344 days.

(21) Appl. No.: 17/089,736

(22) Filed: Nov. 5, 2020

(65) Prior Publication Data
US 2022/0078914 A1      Mar. 10, 2022

(30) Foreign Application Priority Data
Sep. 4, 2020   (MY) ............................ PI2020004594

(51) Int. Cl.
| H05K 1/18 | (2006.01) |
| H01L 23/498 | (2006.01) |
| H01L 23/00 | (2006.01) |
| H01L 23/538 | (2006.01) |
| H05K 3/34 | (2006.01) |
| H05K 3/32 | (2006.01) |

(52) U.S. Cl.
CPC ....... *H05K 1/181* (2013.01); *H01L 23/49816* (2013.01); *H01L 23/5385* (2013.01); *H01L 23/5386* (2013.01); *H01L 24/16* (2013.01); *H05K 3/323* (2013.01); *H05K 3/3436* (2013.01); *H01L 2224/16225* (2013.01); *H05K 2201/10378* (2013.01); *H05K 2201/10734* (2013.01); *H05K 2201/10992* (2013.01)

(58) Field of Classification Search
CPC ......... H05K 3/323; H05K 2201/10378; H05K 2201/10734; H05K 1/0245; H05K 1/111; H05K 2201/10992; H05K 2201/10719; H01L 2224/16225; H01L 23/5386; H01L 23/49816; H01L 23/5385; H01L 23/5383; H01L 23/50; H01L 23/4922; H01L 24/16; H01L 25/0655; H01L 2924/15311; H01L 21/4857
See application file for complete search history.

(56) References Cited

U.S. PATENT DOCUMENTS

| 9,543,197 B2 * | 1/2017 | Hu ......................... H01L 24/24 |
| 2014/0167217 A1 * | 6/2014 | Hu ...................... H01L 23/5389 |
| | | 257/532 |

* cited by examiner

*Primary Examiner* — Jasmine J Clark
(74) *Attorney, Agent, or Firm* — VIERING,JENTSCHURA&PARTNER MBB

(57) ABSTRACT

A chip assembly may include a package substrate that includes one or more pins. The chip assembly may also include one or more pads. The one or more pads may be electrically coupled to the one or more pins. In addition, the chip assembly may include a board that includes one or more board pads. Further, the chip assembly may include an anisotropic layer. The anisotropic layer may be positioned between the board and the one or more pads and between the board and a portion of the package substrate. In addition, the anisotropic layer may mechanically couple the board to the one or more pads and to the portion of the package substrate. Further, the anisotropic layer may electrically couple the one or more pads to the one or more board pads.

20 Claims, 14 Drawing Sheets

CHIP ASSEMBLIES

CROSS-REFERENCE TO RELATED APPLICATION

This application claims priority to Malaysian Patent Application No. PI2020004594, filed on Sep. 4, 2020, which is incorporated by reference herein in its entirety.

FIELD

The aspects discussed in the present disclosure are related to chip assemblies.

BACKGROUND

Unless otherwise indicated in the present disclosure, the materials described in the present disclosure are not prior art to the claims in the present application and are not admitted to be prior art by inclusion in this section.

A chip assembly may include a package substrate positioned between a silicon die and a board. The silicon die may be mechanically coupled to a first surface of the package substrate. In addition, pins or other devices within the silicon die may be electrically coupled to pins or other devices within the package substrate. Further, the board may be mechanically coupled to a second surface of the package substrate. Board pads within the board may also be electrically coupled to pins or other devices within the package substrate.

The subject matter claimed in the present disclosure is not limited to aspects that solve any disadvantages or that operate only in environments such as those described above. Rather, this background is only provided to illustrate one example technology area where some aspects described in the present disclosure may be practiced.

BRIEF DESCRIPTION OF THE DRAWINGS

Example aspects will be described and explained with additional specificity and detail through the use of the accompanying drawings in which.

Figure 1:
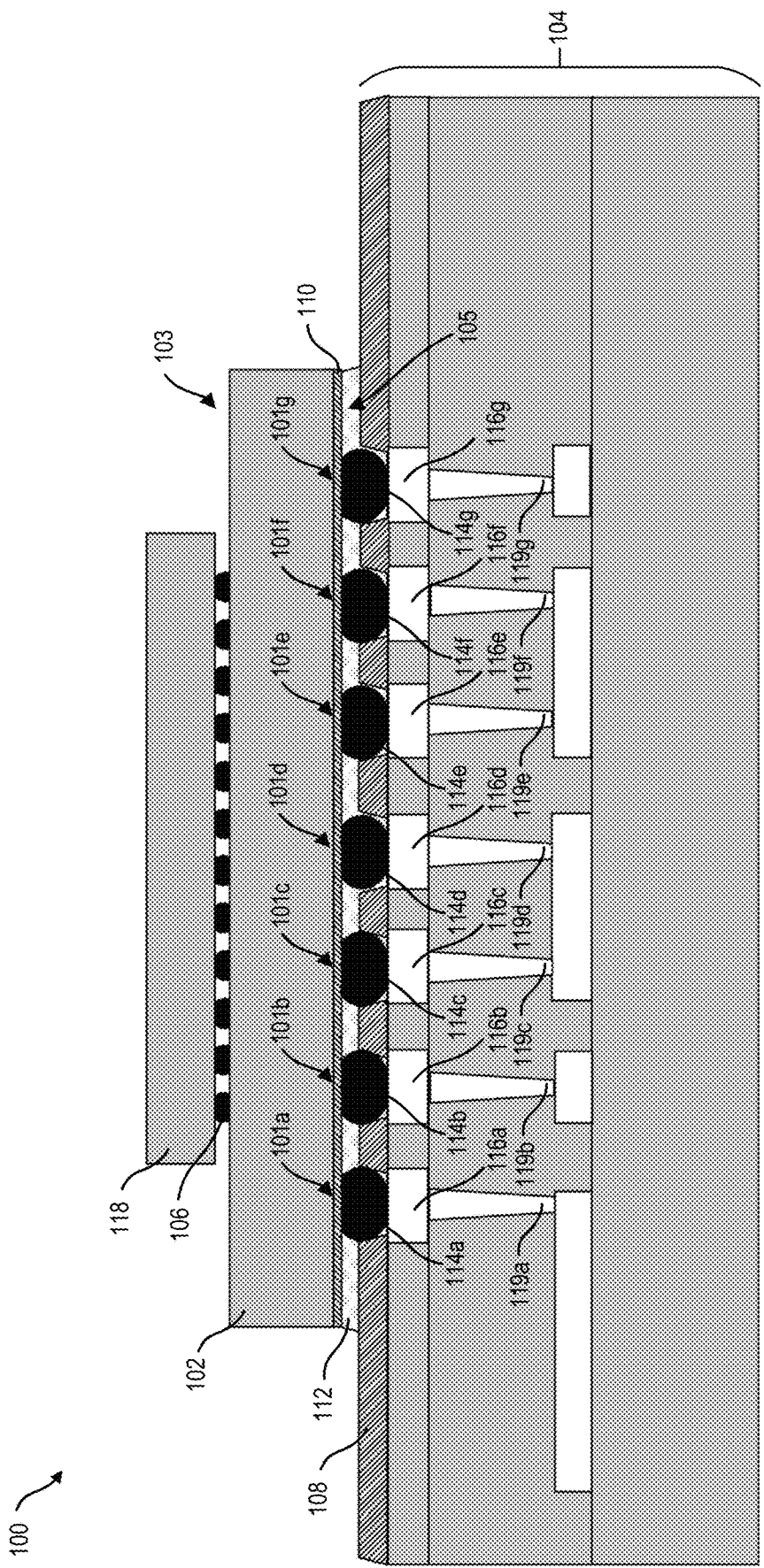
FIG. 1 illustrates a cross sectional view of an example chip assembly that includes a silicon die, a package substrate, and a board.

all according to at least one aspect described in the present disclosure.

DETAILED DESCRIPTION

A chip assembly may include a package substrate positioned between a silicon die and a board. The package substrate may include multiple traces, vias, or any other appropriate device for routing signals from pins on a first surface of the package substrate to pins on a second surface of the package substrate. As used in the present disclosure, the term "pins" may include any appropriate device on a surface of a component for routing signals to or from the component. For example, a pin may include a structure including a pin, a terminal, a bump, a post, a pad, a trace, a via, or a portion of any of these structures, as well as combinations of these or other structures. The silicon die may include multiple pins that are electrically coupled to the pins on the first surface of the package surface. In addition, the silicon die may be mechanically coupled to the first surface of the package substrate. The board may include multiple board pads that are electrically coupled to the pins on the second surface of the package surface. In addition, the board may be mechanically coupled to the second surface of the package substrate. In some aspects, the package substrate may route one or more signals from the board to the silicon die. In these and other aspects, the package substrate may route one or more signals from the silicon die to the board. The board may include multiple traces, vias, or any other appropriate device for routing signals from the board pads to other locations within the board. In some aspects, the board may route the signals to or from multiple devices electrically coupled to the board.

In some chip assemblies, a ball grid array (BGA) may electrically couple pins within the package substrate to the board pads. In addition, the BGA may mechanically couple the package substrate to the board. The chip assembly may include an increased number of solder balls to provide a good return path and improve coupling performance for routing the signals. For example, the chip assembly may include an increased number of solder balls corresponding to system ground (e.g., ground balls) inserted among solder balls corresponding to input output (IO) signals (e.g., IO balls) to improve a simultaneous switching noise (SSN) ratio. For example, the chip assembly for a device for high speed double data rate (DDR) IO may include an IO to ground ball ratio of four to one to improve the SSN ratio. As another example, the chip assembly for a field programmable gate array (FPGA) may include a greater number of solder balls so as to route (e.g., bond out) more IO signals (e.g., bond out IO count). In addition, the chip assembly may include a greater number of solder balls to provide a low impedance loop for power delivery from the board to the package substrate.

A chip assembly for a device with higher IO density or power consumption may include a greater number of solder balls, which may increase a footprint of the package substrate. In some aspects, increasing a number of solder balls (e.g., a ball count) may increase a package size (e.g., the footprint of the package substrate). In these and other aspects, a size of the solder balls may be greater relative to a size of silicon bumps.

A bond IO count (e.g., a number of IO balls versus ground balls and/or power balls) for the chip assembly may be limited when the number of solder balls is increased. For the chip assembly to increase the bond IO count, a total number of solder balls may be increased, which may further increase the footprint of the package substrate. In addition, as the footprint of the package substrate increases, a length of one or more traces within the package substrate may increase accordingly. Increasing the length of one or more traces within the package substrate may increase insertion loss experienced within the package substrate.

Some aspects described in the present disclosure may include a ball-less pad array to electrically couple the package substrate to the board. In some aspects, a chip assembly may include a high density ball-less pad array and an anisotropic layer that replace the BGA. The pad array and the anisotropic layer may electrically couple the pins of the second surface of the package substrate to the board pads. In addition, the anisotropic layer may mechanically couple the package substrate to the board.

In some aspects, the chip assembly may include a bridge device (e.g., a routing distribution layer (RDL)) to provide the one or more signals according to a pinout that is different than the pinout of the package substrate. In these and other aspects, the pad array and the anisotropic layer may electrically couple pins of the bridge device to the board pads. In addition, the anisotropic layer may mechanically couple the bridge device to the board. Further, additional pad arrays and an additional anisotropic layer may electrically couple the pins on a second surface of the package substrate to pins within the bridge device. In addition, the additional anisotropic layer may mechanically couple the package substrate to the bridge device.

In some aspects, the chip assembly may include the bridge device and a multi-chip device. In these and other aspects, the bridge device may include the multi-chip device. In addition, in these and other aspects, the chip assembly may include multiple package substrates. Portions of the pads of the additional pad arrays and the additional anisotropic layer may electrically couple a portion of the pins of the second surfaces of the package substrates to the bridge device. In addition, other portions of the pads of the additional pad arrays and the additional anisotropic layer may electrically couple another portion of the pins of the second surface of the package substrates to the multi-chip device. The multi-chip device may route one or more signals between the package substrates. In some aspects, the additional pad arrays may include pads of different sizes. For example, pads that include a micro size may correspond to pads electrically coupled to the multi-chip device to increase a pad density corresponding to the multi-chip device. Further, the chip assembly may include one or more discrete components to improve performance of the chip assembly.

One or more aspects of the present disclosure may provide a compact interconnection from the package substrate to the board compared to a chip assembly that implements a BGA. In addition, some aspects of the present disclosure may reduce a size of the interconnect compared to a BGA due to a pad size being smaller than the ball size of the solder balls in the BGA. In some aspects, the chip assembly may include a reduced footprint of the package substrate compared to a chip assembly that implements a BGA. Further, some aspects of the present disclosure may reduce insertion loss compared to a chip assembly that includes a BGA due to a reduced length of one or more traces within the package substrate. In these aspects, the length of one or more traces may be reduced due to the reduced footprint of the package substrate. Some aspects of the present disclosure may increase the IO density of the package substrate without increasing the footprint of the package substrate compared to a chip assembly that implements the BGA.

These and other aspects of the present disclosure will be explained with reference to the accompanying figures. It is to be understood that the figures are diagrammatic and schematic representations of such example aspects, and are not limiting, nor are they necessarily drawn to scale. In the figures, features with like numbers indicate like structure and function unless described otherwise.

FIG. 1 illustrates a cross sectional view of an example chip assembly 100 that includes a silicon die 118, a package substrate 102, and a board 104, in accordance with at least one aspect described in the present disclosure. In addition, the chip assembly 100 may include multiple solder bumps 106 and multiple solder balls 114a-g (referenced collectively in the present disclosure as "solder balls 114"). In the figures, a single solder bump 106 is numbered for simplicity of illustration.

The package substrate 102 may include multiple pins 101a-g (referenced collectively in the present disclosure as "pins 101") and a package solder resist layer 110. The pins 101 may form part of a second surface 105 of the package substrate 102. In addition, the package substrate 102 may include multiple pins (not illustrated) that form part of a first surface 103 of the package substrate 102. The board 104 may include board pads 116a-g (referenced collectively in the present disclosure as "board pads 116"), vias 119a-g (referenced collectively in the present disclosure as "vias 119"), and a solder resist layer 108.

The solder balls 114 may be positioned between the second surface of the board 104 and the package substrate 102. The solder balls 114 may electrically couple the pins 101 to the board pads 116. In addition, the solder balls 114 may mechanically couple the package substrate 102 to the board 104 (e.g., mechanically couple the board pads 116 to the package substrate 102). In addition, an underfill layer 112 may be positioned between a portion of the package substrate 102 and a portion of the board 104. The underfill layer 112 may mechanically couple the package substrate 102 to the board 104. In some aspects, the underfill layer 112 may provide support, stability, or some combination thereof to the mechanical coupling provided by the solder balls 114.

The solder bumps 106 may be positioned between the package substrate 102 and the silicon die 118. The solder bumps 106 may electrically couple the silicon die 118 to the pins of the first surface 103. The solder bumps 106 may also mechanically couple the silicon die 118 to the first surface 103.

The solder bumps 106, the package substrate 102 (e.g., pins, vias, traces, or other devices within the package substrate 102), and the solder balls 114 may route one or more signals from the silicon die 118 to the board 104 using the solder bumps 106, the package substrate. The vias 119, pins, traces, or any other appropriate device may route the one or more signals within the board 104. In addition, the solder balls 114, the package substrate 102, and the solder bumps 106 may route one or more signals from the board 104 to the silicon die 118.

In some aspects, a pitch the of the solder balls 114 may include between 0.5 mm and one mm. In addition, a size of the solder balls 114 may include between ten mils and eighteen mils.

Figure 2:
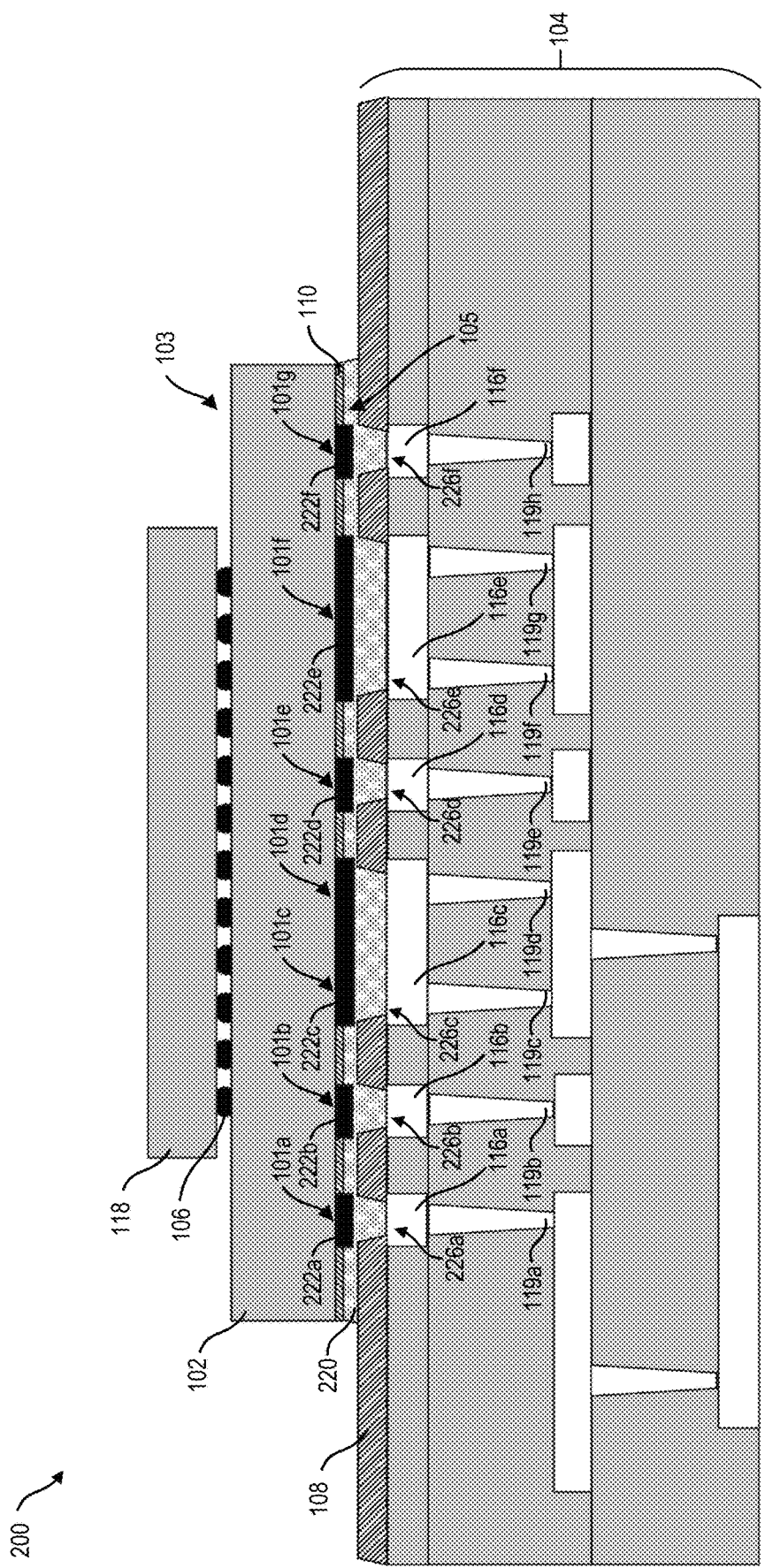
FIG. 2 illustrates a cross sectional view of another example chip assembly that includes the silicon die, the package substrate, and the board.

FIG. 2 illustrates a cross sectional view of another example chip assembly 200 that includes the silicon die 118, the package substrate 102, and the board 104, in accordance with at least one aspect described in the present disclosure. In addition, the chip assembly 200 may include multiple pads 222a-f (referenced collectively in the present disclosure as "pads 222") and an anisotropic layer 220. The pads 222 may be mechanically coupled to the second surface 105. In addition, the pads 222 may be electrically coupled to the pins 101.

The solder resist layer 108 and a board ground layer (physically positioned proximate the solder resist layer 108 and the board pads 116) may define multiple openings 226a-f (referenced collectively in the present disclosure as "openings 226"). In some aspects, the solder resist layer 108 and the board ground layer may define the openings 226 such that the board pads 116 are exposed. The board pads 116; the pads 222; the pins 101; or some combination thereof may be positioned such that when the package substrate 102 is attached to the board 104, the pads 222 are positioned relative to the board pads 226. In addition, the board ground layer may shield the board pads 116, the pads 222, or some combination thereof. For example, the board ground layer may define the openings 226 such that a first pad 222a and a first board pad 116a are shielded from a second pad 222b and a second board pad 116b.

The anisotropic layer 220 may be positioned between the board 104 and the pads 222 and the package substrate 102 (e.g., a portion of package substrate 102). The anisotropic layer 220 may mechanically couple the pads 222 to the board 104. In addition, the anisotropic layer 220 may mechanically couple the package substrate 102 to the board 104. Further, the anisotropic layer 220 may electrically couple the pads 222 to the board pads 116. In some aspects, the anisotropic layer 220 may electrically couple each pad of the pads 222 to a different board pad of the board pads 116.

The solder bumps 106, the package substrate 102 (e.g., pins, vias, traces, or other devices within the package substrate 102), the pads 222, and the anisotropic layer 220 may route one or more signals from the silicon die 118 to the board 104. The vias 119, pins, traces, or any other appropriate device may route the one or more signals within the board 104. In addition, the anisotropic layer 220, the pads 222, the package substrate 102, and the solder bumps 106 may route one or more signals from the board 104 to the silicon die 118.

Figure 3:
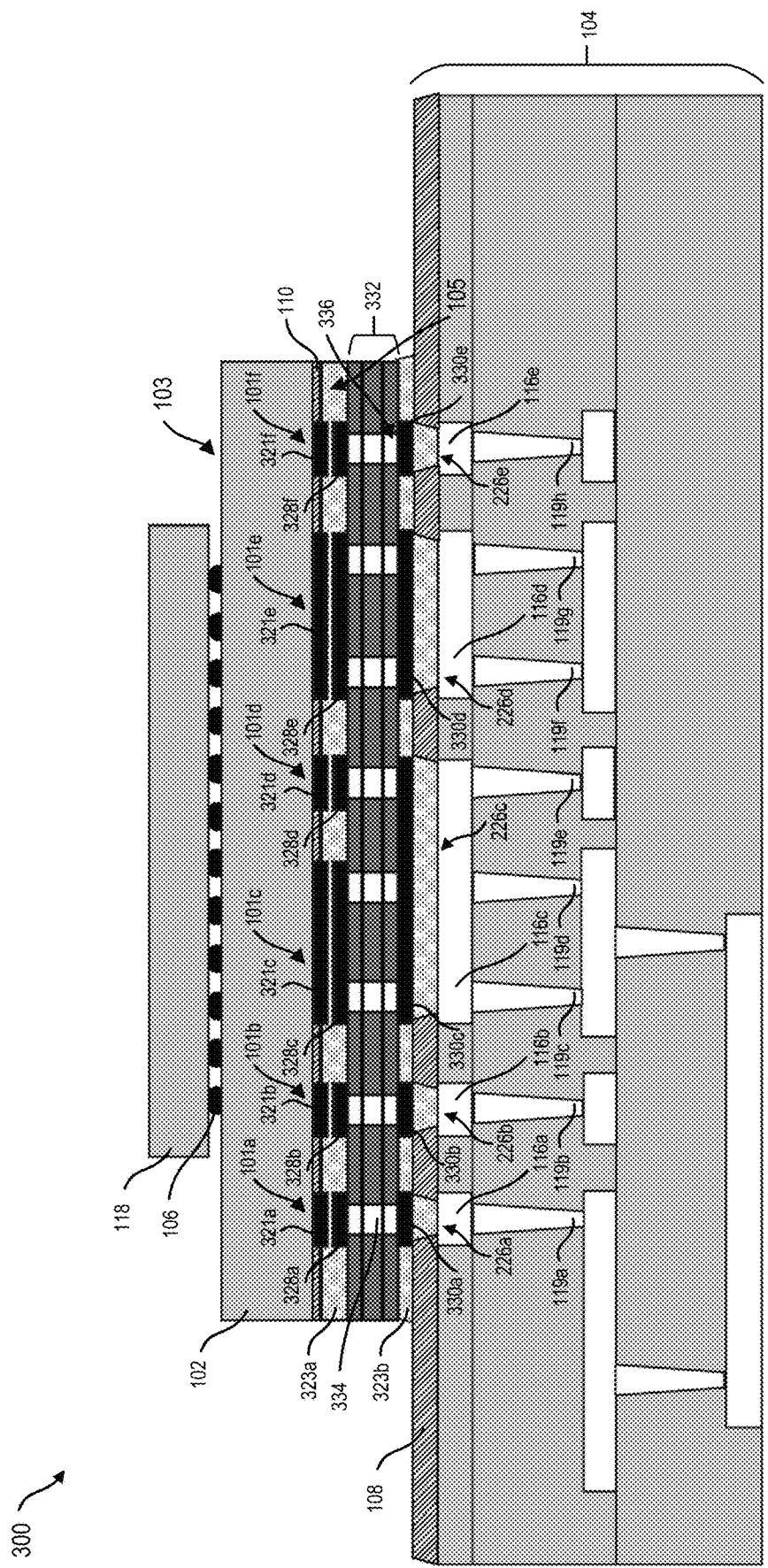
FIG. 3 illustrates a cross sectional view of an example chip assembly that includes a bridge device.

FIG. 3 illustrates a cross sectional view of an example chip assembly 300 that includes a bridge device 332, in accordance with at least one aspect described in the present disclosure. The chip assembly 300 may also include a first set of pads 321a-f (referenced collectively in the present disclosure as "first set of pads 321"), a second set of pads 328a-f (referenced collectively in the present disclosure as "second set of pads 328"), and a third set of pads 330a-e (referenced collectively in the present disclosure as "third set of pads 330"). In some aspects, the package substrate 102 may provide the signals to the first set of pads 321 via the pins 101 according to a first pinout. The first set of pads 321 may correspond to the pads 222 discussed elsewhere in the present disclosure.

A first anisotropic layer 323a may be positioned between a portion of the package substrate 102 and a portion of the bridge device 332. The first anisotropic layer 323a may correspond to the anisotropic layer 220 discussed elsewhere in the present disclosure. In addition, the first anisotropic layer 323a may be positioned between the first set of pads 321 and the second set of pads 328. The first anisotropic layer 323a may mechanically couple a portion of the package substrate 102 to a portion of the bridge device 332. In addition, the first anisotropic layer 323a may mechanically couple the first set of pads 321 to the second set of pads 328. Further, the first anisotropic layer 323a may electrically couple the first set of pads 321 to the second set of pads 328. In some aspects, the first anisotropic layer 323a may electrically couple each pad of the first set of pads 321 to a different pad of the second set of pads 328.

The bridge device 332 may include multiple device vias 334. In the figures, a single solder device via 334 is numbered for simplicity of illustration. In some aspects, the second set of pads 328 may be electrically coupled to first ends of the device vias 334. In these and other aspects, each pad of the second set of pads 328 may be electrically coupled to the first end of a different device via of the device vias 336. The bridge device 332 may include the device vias 336, traces (not illustrated), pins 336, or other devices for routing the signals within the bridge device 332. In the figures, a single pin 336 is numbered for simplicity of illustration.

The third set of pads 330 may be electrically coupled to the pins 336. The bridge device 332 may provide the one or more signals to the third set of pads 330 (e.g., via different second ends of the device vias 334) according to a second pinout. In some aspects, the second pinout may be different than the first pinout. For example, the bridge device 332 may route and combine the signals corresponding to pins 101c and 101d so as to be provided on just pad 330c.

A second anisotropic layer 323b may be positioned between a portion of bridge device 332 and the board 104. The second anisotropic layer 323b may correspond to the anisotropic layer 220 discussed elsewhere in the present disclosure. In addition, the second anisotropic layer 323b may be positioned between the third set of pads 330 and the board 104. The second anisotropic layer 323b may mechanically couple the third set of pads 330 to the board 104. In addition, the second anisotropic layer 323b may mechanically couple the portion of the bridge device 332 to the board 104. Further, the second anisotropic layer 323b may electrically couple the third set of pads 330 to the board pads 116 via the openings 226. In some aspects, the second anisotropic layer 323b may electrically couple each pad of the third set of pads 330 to a different pad of the board pads 116.

The solder bumps 106, the package substrate 102 (e.g., pins, vias, traces, or other devices within the package substrate 102), the first set of pads 321, the first anisotropic layer 323a, the second set pads 328, the bridge device 323 (e.g., pins 336, device vias 334, traces, or other devices within the bridge device 332), the third set of pads 330, and the second anisotropic layer 323b may route one or more signals from the silicon die 118 to the board 104. The vias 119, pins, traces, or any other appropriate device may route the one or more signals within the board 104. In addition, the second anisotropic layer 323b, the third set of pads 330, the bridge device 332, the second set of pads 328, the first anisotropic layer 323a, the first set of pads 321, the package substrate 102, and the solder bumps 106 may route one or more signals from the board 104 to the silicon die 118.

Figure 4:
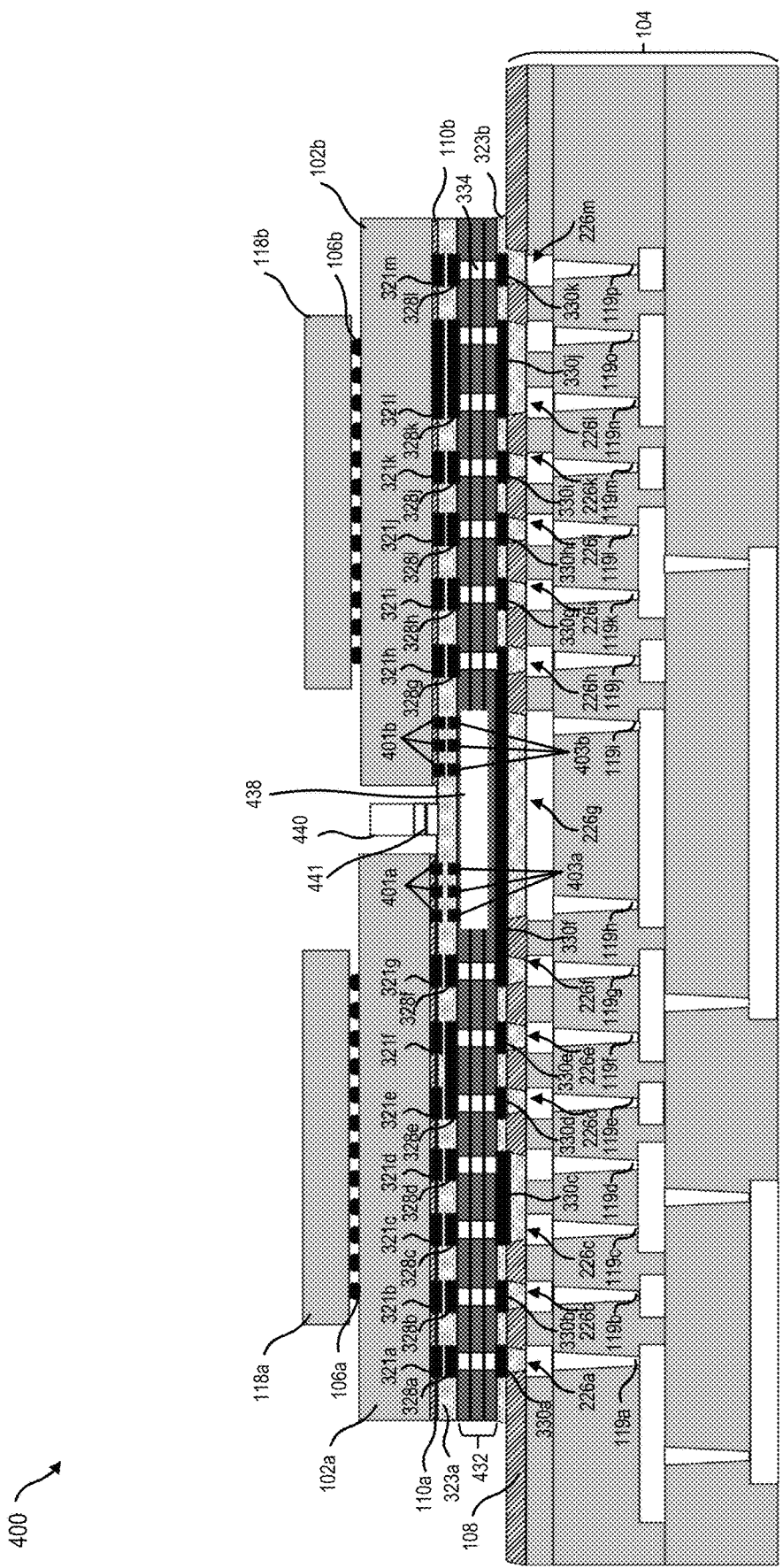
FIG. 4 illustrates a cross sectional view of an example chip assembly that includes a bridge device and a multi-chip device.

FIG. 4 illustrates a cross sectional view of an example chip assembly 400 that includes a bridge device 432 and a multi-chip device 438, in accordance with at least one aspect described in the present disclosure. The chip assembly 400 may include a first silicon die 118a, a second silicon die 118b, a first package substrate 102a, a second package substrate 102b, a discrete component 440, the board 104, and a bridge device 432. The bridge device 432 may operate the same as or similar to the bridge device 332 described in relation to FIG. 3.

The chip assembly 400 may include a first set of bridge pads 401a-b (referenced collectively in the present disclosure as "first set of bridge pads 401") and a second set of bridge pads 403a-b (referenced collectively in the present disclosure as "second set of bridge pads 403"). In some aspects, the first set of bridge pads 401 may form part of the first set of pads 321. In these and other aspects, the second set of bridge pads 403 may form part of the second set of pads 328. In FIG. 4, reference numbers for the pins 101 are omitted for simplicity of illustration. The first package substrate 102a and the second package substrate 102b may, together, provide the signals according to a third pinout.

The first anisotropic layer 323a may be positioned between a portion of the first package substrate 102a and a portion of the bridge device 432. In addition, the first anisotropic layer 323a may be positioned between a portion of the second package substrate 102b and another portion of the bridge device 432. The first anisotropic layer 323a may also be positioned between the first set of pads 321 and the second set of pads 328. Further, the first anisotropic layer 323a may be positioned between the first set of bridge pads 401 and the second set of bridge pads 403.

The first anisotropic layer 323a may mechanically couple the portion of the first package substrate 102a to the portion of the bridge device 432. The first anisotropic layer 323a may also mechanically couple the portion of the second package substrate 102b to the other portion of the bridge device 432. In addition, the first anisotropic layer 323a may mechanically couple the first set of pads 321 to the second set of pads 328. Further, the first anisotropic layer 323a may electrically couple the first set of bridge pads 401 to the second set of bridge pads 403.

The first anisotropic layer 323a may electrically couple the first set of pads 321 to the second set of pads 328. The first anisotropic layer 323a may electrically couple the first set of bridge pads 401 to the second set of bridge pads 403. In some aspects, the first anisotropic layer 323a may electrically couple the pads of the first set of pads 321 to a different number of pads of the second set of pads 328. For example, the first anisotropic layer 323a may electrically couple both pad 321e and pad 321f of the first set of pads 321 to pad 328e of the second set of pads 328. In other aspects, the first anisotropic layer 323a may electrically couple each pad of the first set of pads 321 to a different pad of the second set of pads 328. In addition, the first anisotropic layer 323a may electrically couple each pad of the first set of bridge pads 401 to a different pad of the second set of bridge pads 403.

In some aspects, the second set of pads 328 may be electrically coupled to the first ends of the device vias 334. In these and other aspects, the second set of bridge pads 403 may be electrically coupled to the multi-chip device 438. The bridge device 432 may include the device vias 336, traces (not illustrated), pins 336, or other devices for routing the signals within the bridge device 332. The multi-chip device 438 may include the vias (not illustrated), traces (not illustrated), pins (not illustrated), or other devices for routing signals within the multi-chip device 438. In FIG. 4, the reference number for the pins 336 are omitted for simplicity of illustration.

The third set of pads 330 may be electrically coupled to the pins 336. The bridge device 432 may provide the signals to the third set of pads 330 (e.g., via a second end of the device vias 336) according to a fourth pinout. In addition, the bridge device 432 may route a portion of the signals between the first set of bridge pads 401 and the second set of bridge pads 403 according to the fourth pinout. The fourth pinout may be different than the third pinout.

The second anisotropic layer 323b may be positioned between a portion of bridge device 432 and the board 104. In addition, the second anisotropic layer 323b may be positioned between the third set of pads 330 and the board 104. The second anisotropic layer 323b may mechanically couple the third set of pads 330 to the board 104. In addition, the second anisotropic layer 323b may mechanically couple the portion of the bridge device 432 to the board 104. Further, the second anisotropic layer 323b may electrically couple the third set of pads 330 to the board pads 116 via the openings 226. In FIG. 4, the reference numbers for the board pads 116 are omitted for simplicity of illustration. In some aspects, the second anisotropic layer 323b may electrically couple the pads of the third set of pads 330 to a different number of the board pads 116. For example, the second anisotropic layer 323b may electrically couple pad 330f of the third set of pads 330 to board pad 116g, board pad 116h, and board pad 116i of the board pads 116. In other aspects, the second anisotropic layer 323b may electrically couple each pad of the third set of pads 330 to a different pad of the board pads 116.

In some aspects, the discrete component 440 may be physically positioned between the first package substrate 102a and the second package substrate 102b. In other aspects, the discrete component 440 may be positioned on other sides of the first package substrate 102 a or the second package substrate 102b. A discrete pad 441 may electrically couple the discrete component 440 to the first anisotropic layer 323a. In some aspects, the first anisotropic layer 323a may be positioned between the discrete pad 441 and a portion of the multi-chip device 438. In other aspects, the first anisotropic layer 323a may be positioned between the discrete pad 441 and a portion of the bridge device 432. The first anisotropic layer 332a may mechanically couple the discrete pad 441 to the multi-chip device 438, the bridge 432, or some combination thereof.

Figure 5:
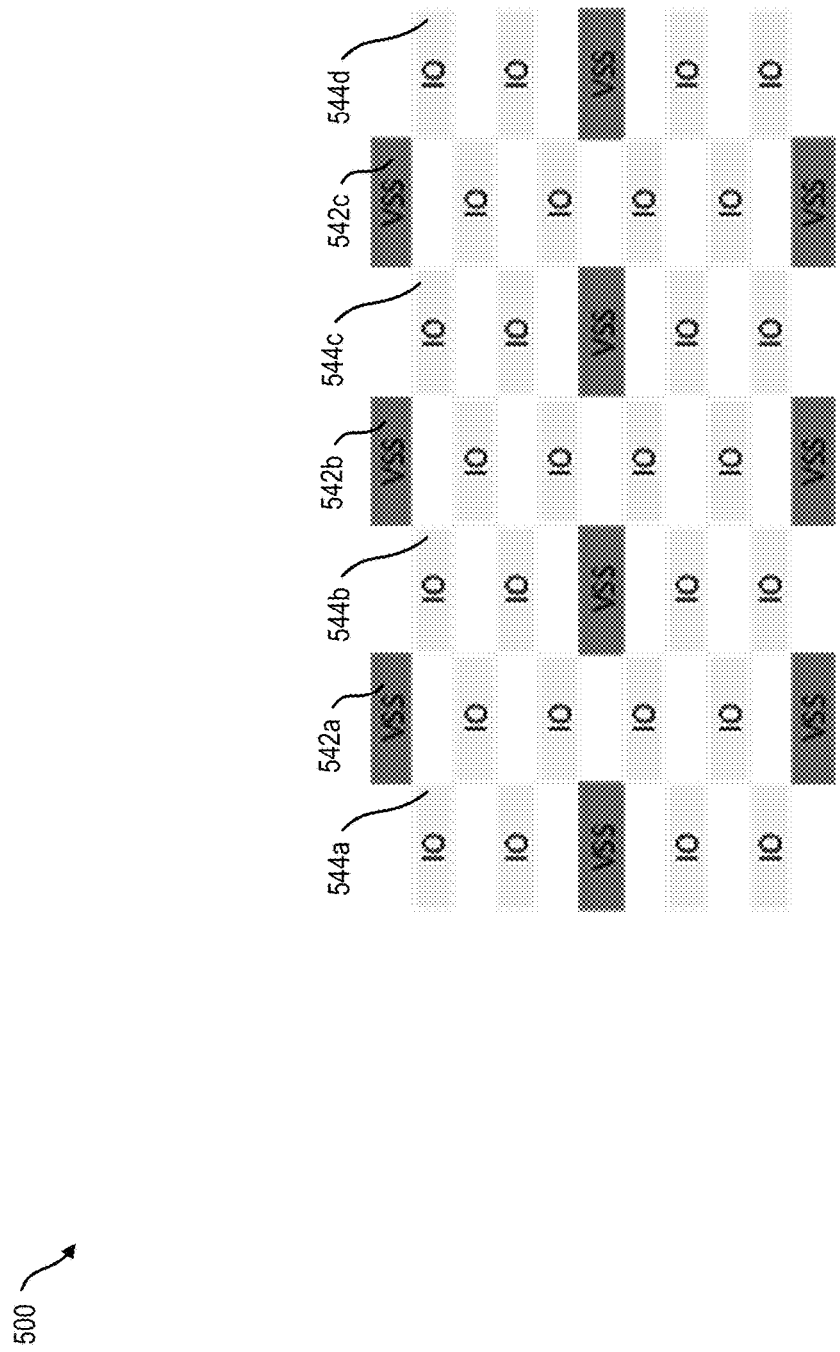
FIG. 5 illustrates an example arrangement of a portion of a ball grid array.

FIG. 5 illustrates an example arrangement of a portion of a BGA 500, in accordance with at least one aspect described in the present disclosure. The BGA 500 may correspond to a pinout of a DDR 5 device. The BGA 500 may include signals balls 544a-d (referenced collectively in the present disclosure as "signal balls 544") and ground balls 542a-c (referenced collectively in the present disclosure as "ground balls 542"). In FIG. 5 a single row of the signal balls 544 and a single row of the ground balls 542 are numbered for simplicity of illustration. To provide good signal return path and coupling performance for the DDR5 device, a chip assembly may include a ratio of one ball of the ground balls 542 for every four signal balls 544. The ratio of ground balls 542 to signal balls 544 may improve or worsen SSN performance of the package substrate.

Figure 6:
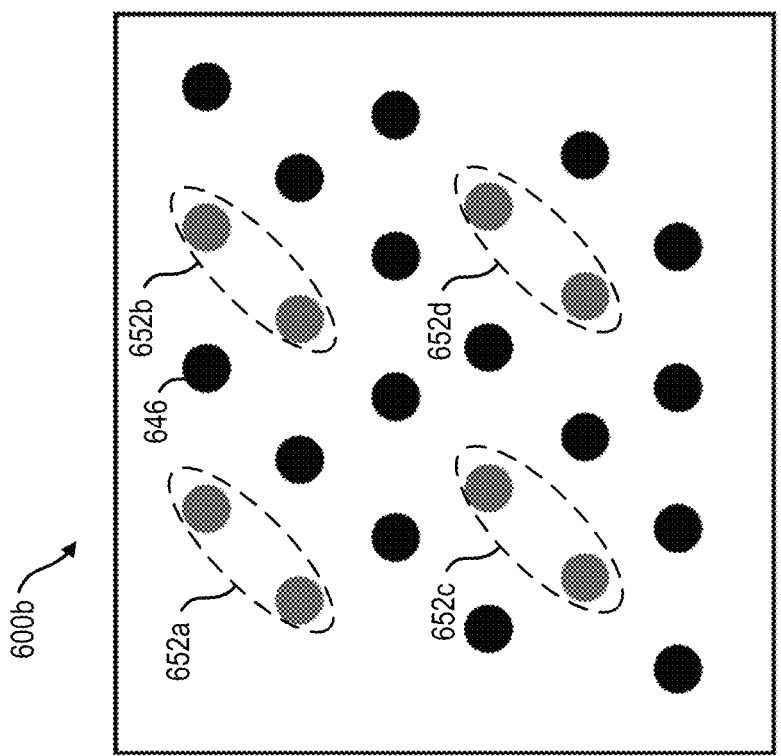
FIG. 6 illustrates example ball grid arrays.
Figure 6:
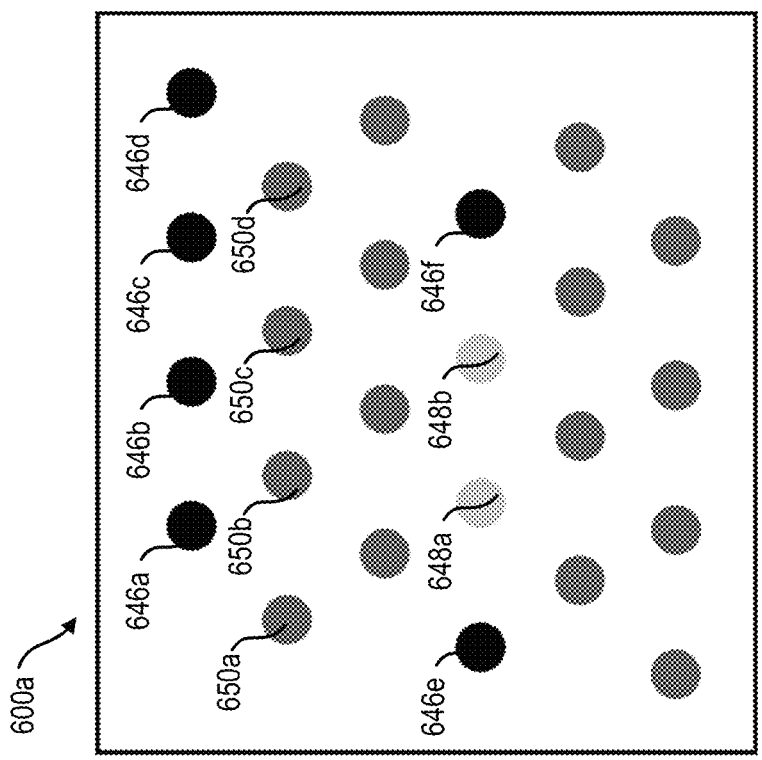

FIG. 6 illustrates example BGAs 600a-b, in accordance with at least one aspect described in the present disclosure. The BGA 600a may include multiple ground balls 646a-f (referenced collectively in the present disclosure as "ground balls 646"), multiple power balls 648a-b (referenced collectively in the present disclosure as "power balls 648"), and multiple signal balls 650a-d (referenced collectively in the present disclosure as "signal balls 650"). In FIG. 6 a single row of the signal balls 650 is numbered for simplicity of illustration. The number of the ground balls 646 may control return path and shielding for high speed signals on the signal balls 650. As shown in the BGA 600a, the BGA 600a may include a ratio of six ground balls 646 to two power balls 648 and sixteen signals balls 650 to achieve the return path shielding for high speed signals on the signal balls 650.

The BGA 600b may correspond a transceiver device implementing different pair signals. The BGA 600b may include differential signal pair sets 652a-d (referenced collectively in the present disclosure as "different signal pair sets 652"). Each set of the different signal pair sets 652 may correspond to a different differential signal pair. The BGA 600b may also include ground balls 646 positioned around the differential signal pair sets 652 to shield the differential pair sets 652 from each other. In FIG. 6, a single ground ball 646 is numbered for simplicity of illustration.

Figure 7:
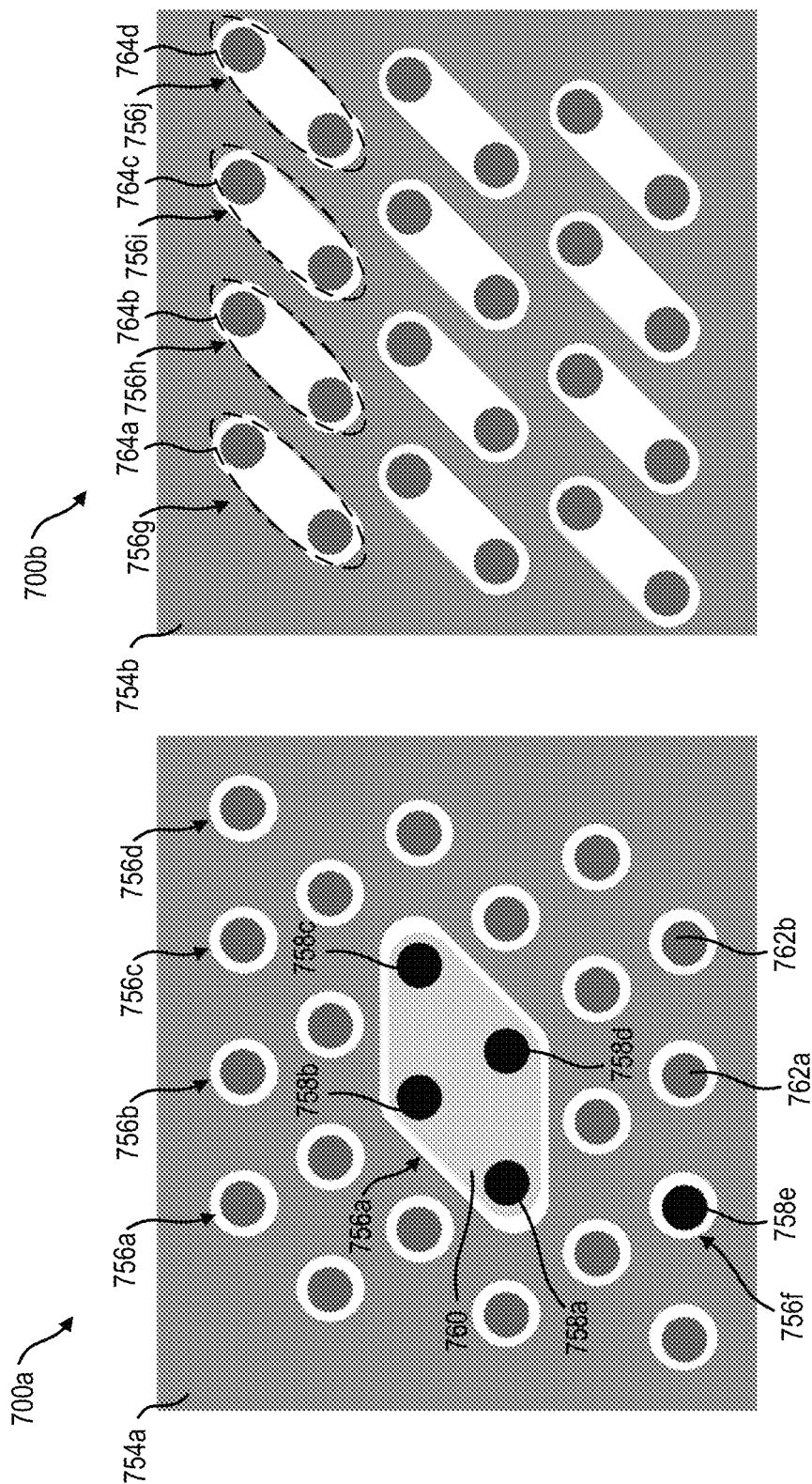
FIG. 7 illustrates example ground layers and example pad arrays.

FIG. 7 illustrates example ground layers 754a-b and example pad arrays 700a-b, in accordance with at least one aspect described in the present disclosure. The ground layers 754a-b may correspond to the board ground layer (e.g., the board ground layer physically positioned proximate the solder resist layer 108) described in the present disclosure.

In the pad array 700a, a portion of the ground layer 754a may define multiple openings 756a-f (referenced collectively in the present disclosure as "openings 756"). In FIG. 7, only a portion of the openings 756 defined by ground layer 754a are numbered for simplicity of illustration. The openings 756 may correspond to the openings 226 discussed elsewhere in the present disclosure. The openings 756 may expose the board pads 116 or may correspond to the other sets of pads (e.g., the set of pads 222 and the third set of pads 330. In some aspects, a portion of the pads may include power pads 758a-e (referenced collectively in the present disclosure as "power pads 758") another portion of the pads may include signal pads 762a-b (referenced collectively in the present disclosure as "signal pads 762"). In some aspects two or more of the power pads 758 may be positioned together relative to a single opening 756. For example, power pads 758a-d may be positioned together to correspond to single opening 756a. In addition, a gang pad 760 may be electrically coupled to each pad of the grouped pads. The gang pad 760 may correspond to a pad of the set of pads 222, the third set of pads 330, or the board pads 116. Each signal pad 762 may be positioned relative to a different opening 756. The ground layer 754a may shield each signal pad 762 from each other and may shield the signals pads 762 from the power pads 758.

In the pad array 700b, a portion of the ground layer 754b may define openings 756g-j. In FIG. 7, only a portion of openings 756 of the ground layer 754b are numbered for simplicity of illustration. In some aspects, the pads may include differential signal pair sets 764a-d (referenced collectively in the present disclosure as "differential signal pair sets 764"). in FIG. 7, only a portion of the differential signal pairs sets 764 are numbered for simplicity of illustration. Each set of the different differential signal pair sets 764 may correspond to a different differential signal pair. In addition, the pads corresponding to the different differential signal pair sets 764 may be positioned relative to different openings 756. The ground layer 754b may shield the pads that correspond to different differential signal pair sets 764 from each other.

Figure 8:
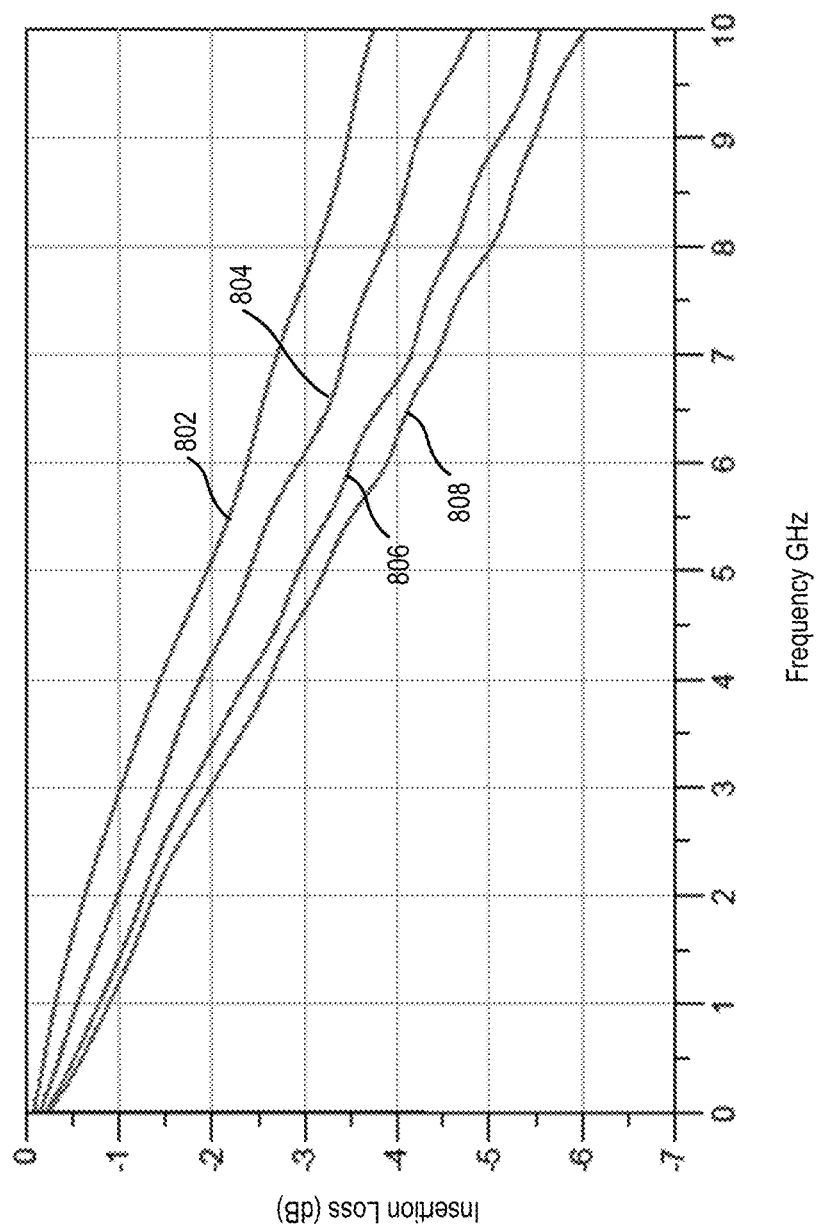
FIG. 8 illustrates a graphical representation of insertion loss versus frequency of signal traces within the package substrate.

FIG. 8 illustrates a graphical representation 800 of insertion loss versus frequency of signal traces within the package substrate, in accordance with at least one aspect described in the present disclosure. In some aspects, if the size of the package substrate increases, the length of traces within the package substrate may also increase. Longer traces may increase signal insertion loss and reduce bandwidth of high speed signals.

Curves 802, 804, 806, and 808 respectively represent insertion loss versus frequency of traces that are five mm, fifteen mm, twenty five mm, and thirty mm, respectively. As illustrated in FIG. 8, as the length of the length of the traces are reduced, the insertion loss improves (e.g., a value of the insertion loss increases).

Figure 9:
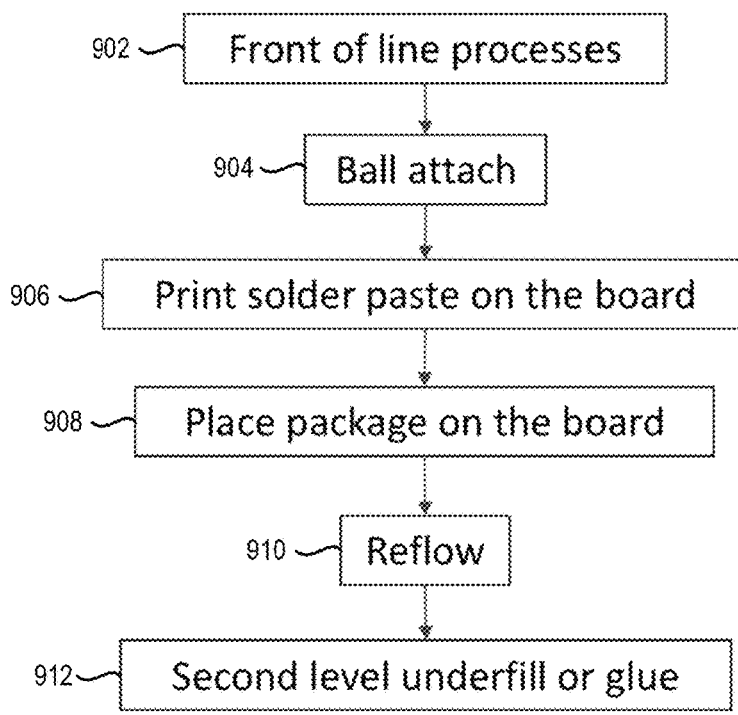
FIG. 9 illustrates an exemplary flowchart of a method of fabricating a chip assembly.

FIG. 9 illustrates an exemplary flowchart of a method 900 of fabricating a chip assembly, in accordance with at least one aspect described in the present disclosure. The method 900 may be performed by any suitable system, apparatus, or device with respect to fabricating (e.g., manufacturing) a chip assembly. The method 900 may include one or more blocks 902, 904, 906, 908, 910, or 912. Although illustrated with discrete blocks, the steps and processes associated with one or more of the blocks of the method 900 may be divided into additional blocks, combined into fewer blocks, or eliminated, depending on the particular implementation.

At block 902, the method 900 may include performing front of line processes. In some aspects, the method 900 may include performing the front of line processes to form a wafer that includes multiple board dies. Each board die may be the same as or similar to the board 104 described elsewhere in the present application. In these and other aspects, the method 900 may include performing the front of line processes to form a wafer that includes multiple silicon dies. Each silicon die may be the same as or similar to the silicon die 118 described elsewhere in the present disclosure. Further, in some aspects, the method 900 may include performing the front of line processes to form a wafer that includes multiple package substrate dies. Each package substrate die may be the same as or similar to the package substrate 102 described elsewhere in the present disclosure.

The method 900 may include adding layers to the wafers to form vias, integrated circuits, components, or any other appropriate device within the silicon dies, the package substrate dies, or the board dies within the wafers. For example, the method 900 may include photomasking, etching, diffusion, metal deposition, passivation, or any other appropriate process. In some aspects, the method may include cutting the wafers (e.g., die cutting) to separate each board die, silicon die, or package substrate die within the wafers.

At block 904, the method 900 may include attaching balls. In some aspects, the method 900 may include attaching the balls to the board dies. The method 900 may include attaching the balls to the board dies to form BGAs. The BGAs may be formed as described elsewhere in the present disclosure.

At block 906, the method 900 may include printing solder paste on the board. In some aspects, the method 900 may include printing the solder paste on a surface of each of the board dies. In some aspects, the method 900 may include printing the solder paste on the surface of the board dies to provide support, stability, or some combination thereof to any mechanical coupling provided by the BGAs.

At block 908, the method 900 may include placing a package on the board. In some aspects, the method 900 may include attaching each of the silicon dies to different package substrate dies using solder bumps to form packages. The method 900 may also include placing each package on a different board die. The method 900 may include placing the packages on the board dies relative to the BGAs so as to electrically couple pins within the package substrates to the balls of the BGAs.

At block 910, the method 900 may include performing reflow. The method 900 may include performing reflow to cause the solder paste to change to a molten state to mechanically couple the packages (e.g., the package substrates) to the board dies. In addition, the method 900 may include performing reflow to cause the balls of the BGAs to change to a molten state to mechanically couple and electrically couple the package substrates to the BGAs.

At block 912, the method 900 may include applying a second level underfill or glue. The method 900 may include applying the second level underfill or glue to the chip assemblies to fill open spaces between the packages and the board dies, the silicon dies and the package substrates, or some combination thereof. The method 900 may include fabricating the chip assemblies such that the solder bumps, the package substrates, and the BGAs route signals from the silicon dies to the boards. In addition, the method 900 may include fabricating the chip assemblies such that the BGAs, the package substrates, and the solder bumps route signals from the boards to the silicon dies.

Modifications, additions, or omissions may be made to the method 900 without departing from the scope of the present disclosure. For example, the method 900 may be implemented in differing order. Additionally or alternatively, two or more processes may be performed at the same time. Furthermore, the outlined processes and actions are only provided as examples, and some of the processes and actions may be optional, combined into fewer processes and actions, or expanded into additional processes and actions without detracting from the essence of the described aspects.

Figure 10:
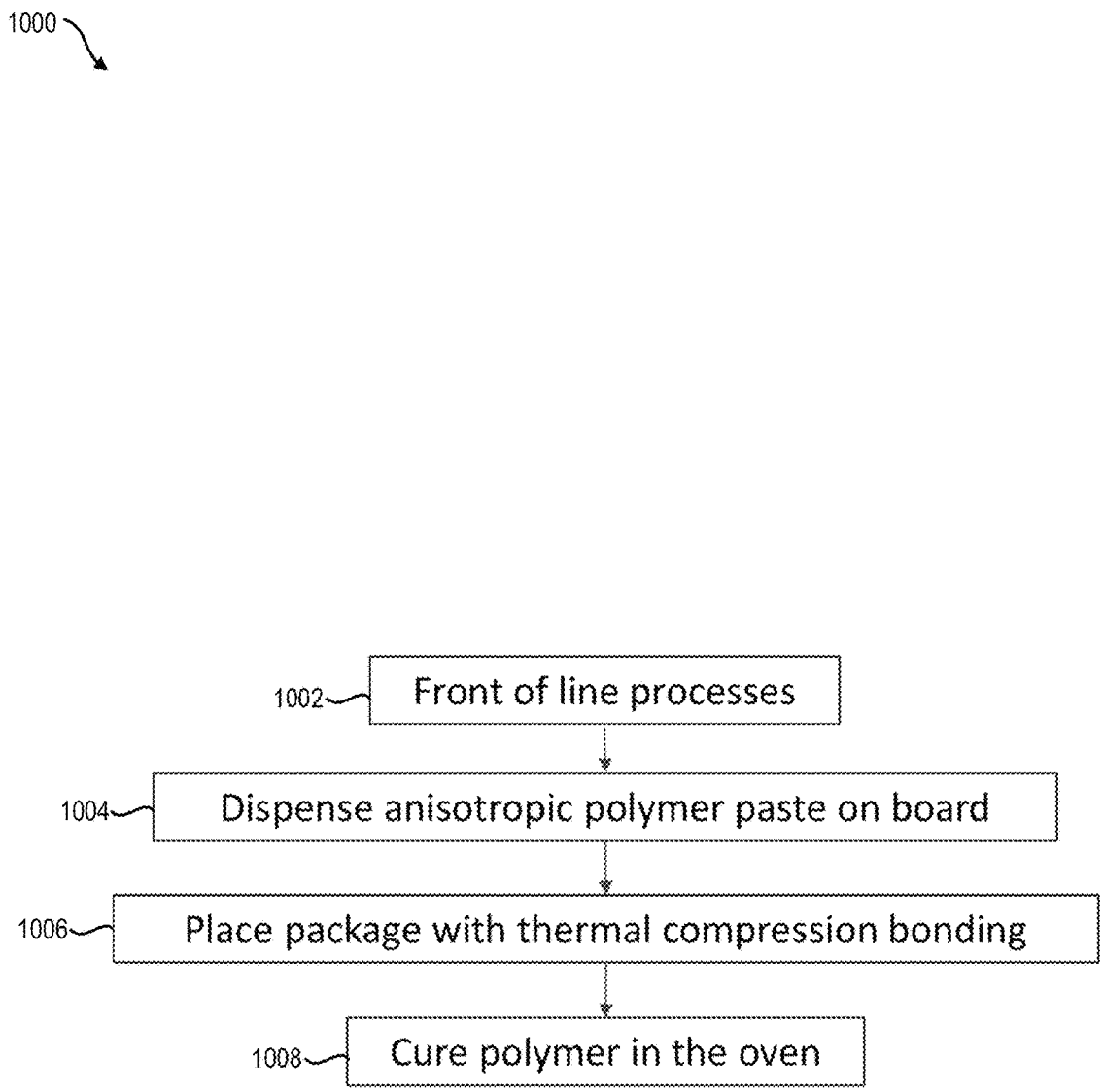
FIG. 10 illustrates another exemplary flowchart of a method of fabricating a chip assembly.

FIG. 10 illustrates another exemplary flowchart of a method of fabricating a chip assembly, in accordance with at least one aspect described in the present disclosure. The method 1000 may be performed by any suitable system, apparatus, or device with respect to fabricating (e.g., manufacturing) a chip assembly. The method 1000 may include one or more blocks 1002, 1004, 1006, or 1008. Although illustrated with discrete blocks, the steps and processes associated with one or more of the blocks of the method 1000 may be divided into additional blocks, combined into fewer blocks, or eliminated, depending on the particular implementation.

At block 1002, the method 1000 may include performing front of line processes. In some aspects, the method 1000 may include performing the front of line processes to form a wafer that includes multiple board dies. Each board die may be the same as or similar to the board 104 described elsewhere in the present application. In these and other aspects, the method 1000 may include performing the front of line processes to form a wafer that includes multiple silicon dies. Each silicon die may be the same as or similar to the silicon die 118 described elsewhere in the present disclosure. Further, in some aspects, the method 1000 may include performing the front of line processes to form a wafer that includes multiple package substrate dies. Each package substrate die may be the same as or similar to the package substrate 102 described elsewhere in the present disclosure.

The method 1000 may include adding layers to the wafers to form vias, integrated circuits, components, or any other appropriate device within the silicon dies, the package substrate dies, or the board dies within the wafers. For example, the method 1000 may include photomasking, etching, diffusion, metal deposition, passivation, or any other appropriate process. In some aspects, the method 1000 may include cutting the wafers to separate each board die, silicon die, or package substrate die within the wafers. In addition, the method 1000 may include forming multiple openings in a ground layer of the wafers that include the board dies. The method 1000 may include forming the openings to expose board pads within the board dies.

At block 1004, the method 1000 may include dispensing an anisotropic polymer paste on a board. The method 1000 may include dispensing the anisotropic polymer paste on the board dies relative to the board pads. The anisotropic polymer paste may correspond to the anisotropic layers 220 described elsewhere in the present disclosure.

At block 1006, the method 1000 may include placing a package with thermal compression bonding. In some aspects, the method 1000 may include attaching each of the silicon dies to different package substrate dies using solder bumps to form packages. The method 1000 may also include forming each package to include multiple pads positioned relative to pins within the corresponding package substrate dies. The method 1000 may include placing the packages on the anisotropic polymer paste relative to the board pads of the different board dies. The method 1000 may include placing the packages on the anisotropic polymer paste such that the pads are positioned relative the board pads within the corresponding board dies.

The method 1000 may include bonding the package to the anisotropic polymer paste using thermal compression. In addition, the method 1000 may include bonding the board dies and the packages to the anisotropic polymer paste using thermal compression. In some aspects, the method 1000 may include applying a temperature to the anisotropic polymer paste to cause the anisotropic polymer paste to become soft and adhere to the board dies and the packages (e.g., the pads and a portion of the package substrates). In these and other aspects, the method 1000 may include applying pressure to the packages to compress the anisotropic polymer paste between the packages and the board dies while the anisotropic polymer paste is soft. The method 1000 may include applying the pressure to the packages to cause the pads to be within a particular physical proximity of the board pads of the corresponding board dies. The method 1000 may include applying the pressure to the packages such that the physical proximity of the pads to the board pads of the corresponding board dies may cause the pads to be electrically coupled to the board pads.

At block 1008, the method 1000 may include curing the polymer in the oven. In some aspects, the method 1000 may include curing the anisotropic polymer paste to cause the anisotropic polymer paste to harden and maintain the physical proximity of the pads to the board pads of the corresponding board dies and the mechanical coupling between the packages and the board dies. The method 1000 may include fabricating the chip assemblies such that the solder bumps, the package substrates, the pads, and the anisotropic polymer paste route signals from the silicon dies to the board dies. In addition, the method 1000 may include fabricating the chip assemblies such that the anisotropic polymer paste, the pads, the package substrates, and the solder bumps route signals from the board dies to the silicon dies.

Modifications, additions, or omissions may be made to the method 1000 without departing from the scope of the present disclosure. For example, the processes of method 1000 may be implemented in differing order. Additionally or alternatively, two or more processes may be performed at the same time. Furthermore, the outlined processes and actions are only provided as examples, and some of the processes and actions may be optional, combined into fewer processes and actions, or expanded into additional processes and actions without detracting from the essence of the described aspects.

Figure 11:
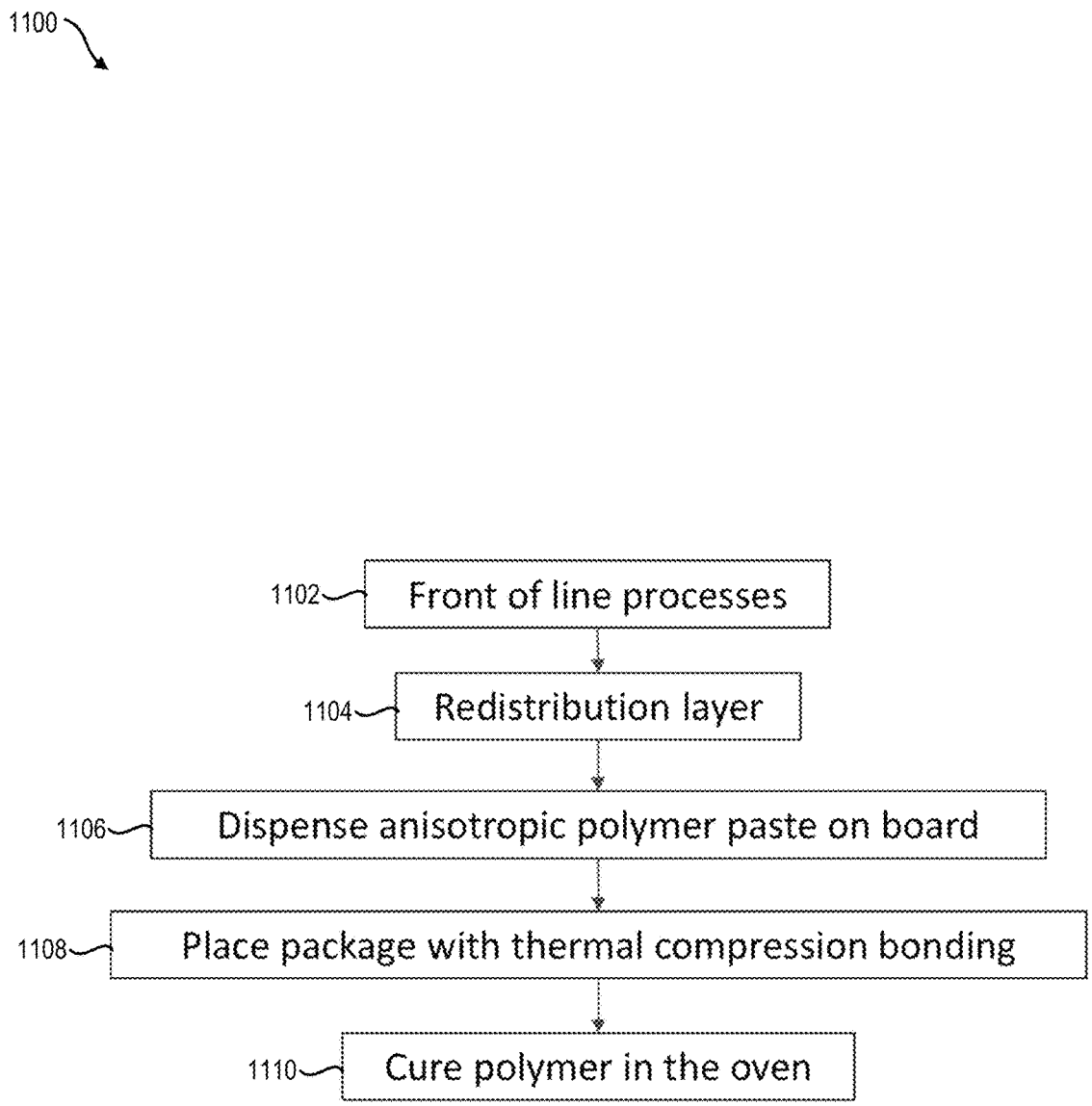
FIG. 11 illustrates an exemplary flowchart of a method of fabricating a chip assembly that includes a redistribution layer.

FIG. 11 illustrates an exemplary flowchart of a method 1100 of fabricating a chip assembly that includes a redistribution layer, in accordance with at least one aspect described in the present disclosure. The method 1100 may be performed by any suitable system, apparatus, or device with respect to fabricating (e.g., manufacturing) a chip assembly. The method 1100 may include one or more blocks 1102, 1104, 1106, 1108, or 1110. Although illustrated with discrete blocks, the steps and processes associated with one or more of the blocks of the method 1100 may be divided into additional blocks, combined into fewer blocks, or eliminated, depending on the particular implementation.

At block 1102, the method 1100 may include performing front of line processes. In some aspects, the method 1100 may include performing the front of line processes to form a wafer that includes multiple board dies. Each board die may be the same as or similar to the board 104 described elsewhere in the present application. In these and other aspects, the method 1100 may include performing the front of line processes to form a wafer that includes multiple silicon dies. Each silicon die may be the same as or similar to the silicon die 118 described elsewhere in the present disclosure. Further, in some aspects, the method 1100 may include performing the front of line processes to form a wafer that includes multiple package substrate dies. Each package substrate die may be the same as or similar to the package substrate 102 described elsewhere in the present disclosure.

The method 1100 may include adding layers to the wafers to form vias, integrated circuits, components, or any other appropriate device within the silicon dies, the package substrate dies, or the board dies within the wafers. For example, the method 1100 may include photomasking, etching, diffusion, metal deposition, passivation, or any other appropriate process. In some aspects, the method 1100 may include cutting the wafers to separate each board die, silicon die, or package substrate die within the wafers. In addition, the method 1100 may include forming multiple openings in a ground layer of the wafers to expose board pads within the board dies.

At block 1104, the method 1100 may include forming a redistribution layer. In some aspects, the method 1100 may include forming the redistribution layers to include vias, pins, or any other appropriate component. The redistribution layers may be the same as or similar to the bridge device 332 described elsewhere in the present disclosure. The method 1100 may include forming the redistribution layers such that the redistribution layer routes signals and provides the signals according to different pinouts than the package substrate dies. In addition, the method 1100 may include forming the redistribution layers as part of the package dies.

At block 1106, the method 1100 may include dispensing an anisotropic polymer paste on a board. The method 1100 may include dispensing the anisotropic polymer paste on the board dies relative to the board pads. The anisotropic polymer paste may correspond to the anisotropic layers 323a,b described elsewhere in the present disclosure.

At block 1108, the method 1100 may include placing a package with thermal compression bonding. In some aspects, the method 1100 may include attaching each of the silicon dies to different package substrate dies including the redistribution layers using solder bumps to form packages. The method 1100 may also include forming each package to include multiple pads positioned relative to pins within the corresponding redistribution layers. The method 1100 may include placing the packages on the anisotropic polymer paste relative to the board pads of the different board dies. The method 1100 may include placing the packages on the anisotropic polymer paste such that the pads are positioned relative the board pads within the corresponding board dies.

The method 1100 may include bonding the package to the anisotropic polymer paste using thermal compression. In addition, the method 1100 may include bonding the board dies and the packages to the anisotropic polymer paste using thermal compression. In some aspects, the method 1100 may include applying a temperature to the anisotropic polymer paste to cause the anisotropic polymer paste to become soft and adhere to the board dies and the packages (e.g., the pads and a portion of the package substrates). In these and other aspects, the method 1100 may include applying pressure to the packages to compress the anisotropic polymer paste between the packages and the board dies while the anisotropic polymer paste is soft. The method 1100 may include applying the pressure to the packages to cause the pads to be within a particular physical proximity of the board pads of the corresponding board dies. The method 1100 may include applying the pressure to the packages such that the physical proximity of the pads to the board pads of the corresponding board dies may cause the pads to be electrically coupled to the board pads.

At block 1110, the method 1100 may include curing the polymer in the oven. In some aspects, the method 1100 may include curing the anisotropic polymer paste to cause the anisotropic polymer paste to harden and maintain the physical proximity of the pads to the board pads of the corresponding board dies and the mechanical coupling between the packages and the board dies. The method 1100 may include fabricating the chip assemblies such that the solder bumps, the package substrates, the redistribution layers, the pads, and the anisotropic polymer paste route signals from the silicon dies to the boards. In addition, the method 1100 may include fabricating the chip assemblies such that the anisotropic polymer paste, the pads, the redistribution layers, the package substrates, and the solder bumps route signals from the boards to the silicon dies. In addition, the method 1100 may form the redistribution layer such that the redistribution layer may provide signals to the board according to a pinout that is different than a pinout of package substrate.

Modifications, additions, or omissions may be made to the method 1100 without departing from the scope of the present disclosure. For example, the processes of method 1100 may be implemented in differing order. Additionally or alternatively, two or more processes may be performed at the same time. Furthermore, the outlined processes and actions are only provided as examples, and some of the processes and actions may be optional, combined into fewer processes and actions, or expanded into additional processes and actions without detracting from the essence of the described aspects.

Figure 12:
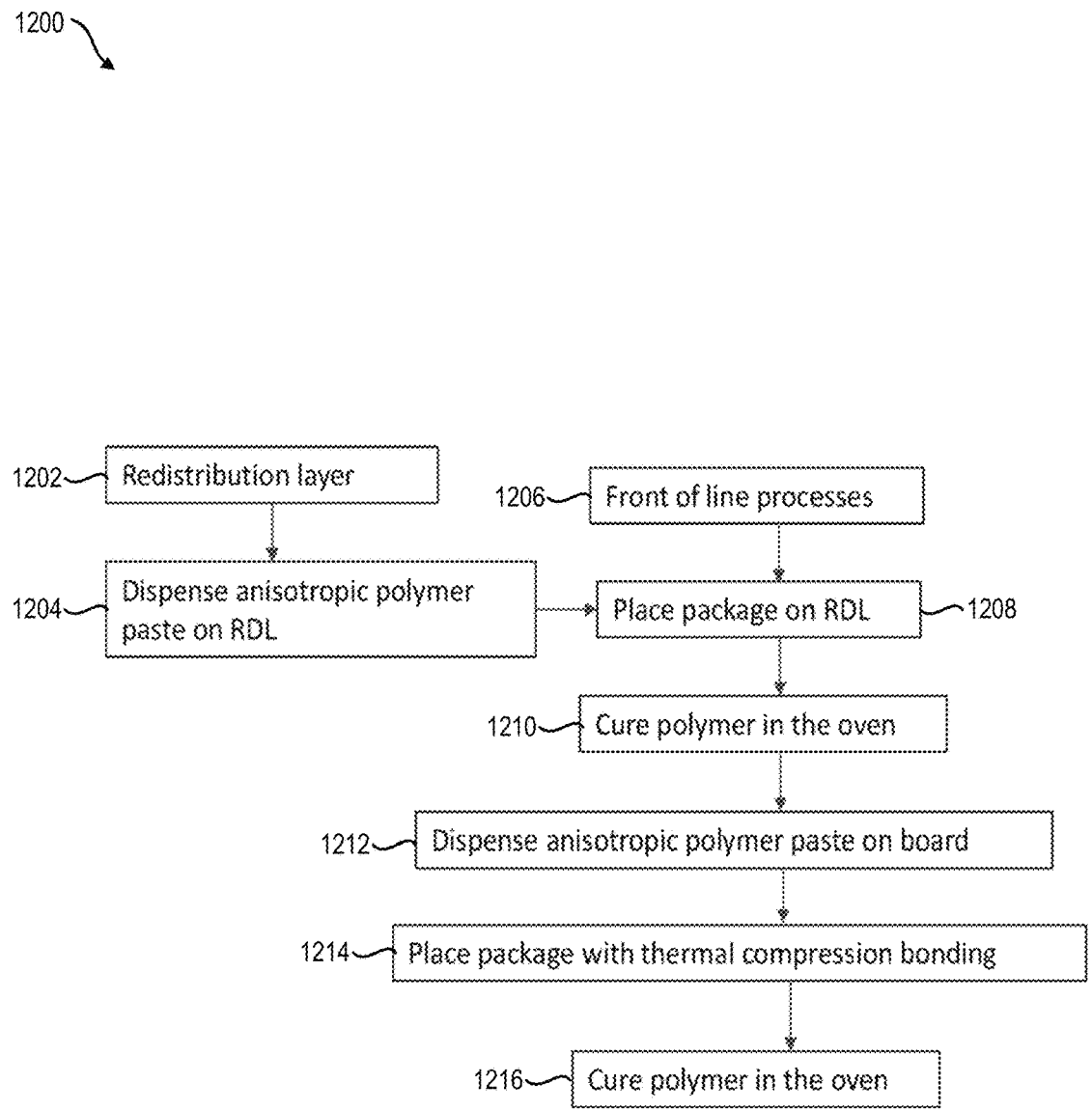
FIG. 12 illustrates another exemplary flowchart of a method of fabricating a chip assembly that includes a redistribution layer.

FIG. 12 illustrates another exemplary flowchart of a method of fabricating a chip assembly that includes a redistribution layer, in accordance with at least one aspect described in the present disclosure. The method 1200 may be performed by any suitable system, apparatus, or device with respect to fabricating (e.g., manufacturing) a chip assembly. The method 1200 may include one or more blocks 1202, 1204, 1206, 1208, 1210, 1212, 1214, or 1216. Although illustrated with discrete blocks, the steps and processes associated with one or more of the blocks of the method 1200 may be divided into additional blocks, combined into fewer blocks, or eliminated, depending on the particular implementation.

At block 1202, the method 1200 may include forming a redistribution layer. In some aspects, the method 1200 may include forming the redistribution layers to include vias, pins, or any other appropriate component. In some aspects, the method 1200 may include forming the redistribution layers to include multi-chip devices for routing signals from one package substrate to an additional package substrate. The redistribution layers may be the same as or similar to the bridge devices 332 and 432 described elsewhere in the present disclosure. The method 1200 may include forming the redistribution layers such that the redistribution layers route signals.

In addition, the method 1200 may include forming the redistribution layers with second sets of pads mechanically coupled and electrically coupled to surfaces of the corresponding redistribution layers. Further, the method 1200 may include forming the redistribution layers with third sets of pads mechanically coupled and electrically coupled to different surfaces of the redistribution layers.

At block 1204, the method 1200 may include dispensing an anisotropic polymer paste on the redistribution layer. The method 1200 may include dispensing the anisotropic polymer paste on the redistribution layers relative to the second sets of pads. The anisotropic polymer paste may correspond to the anisotropic layer 323a described elsewhere in the present disclosure.

At block 1206, the method 1200 may include performing front of line processes. In some aspects, the method 1200 may include performing the front of line processes to form a wafer that includes multiple board dies. Each board die may be the same as or similar to the board 104 described elsewhere in the present application. In these and other aspects, the method 1200 may include performing the front of line processes to form a wafer that includes multiple silicon dies. Each silicon die may be the same as or similar to the silicon die 118 described elsewhere in the present disclosure. Further, in some aspects, the method 1200 may include performing the front of line processes to form a wafer that includes multiple package substrate dies. Each package substrate die may be the same as or similar to the package substrate 102 described elsewhere in the present disclosure.

The method 1200 may include adding layers to the wafers to form vias, integrated circuits, components, or any other appropriate device within the silicon dies, the package substrate dies, or the board dies within the wafers. For example, the method 1200 may include photomasking, etching, diffusion, metal deposition, passivation, or any other appropriate process. In some aspects, the method 1200 may include cutting the wafers to separate each board die, silicon die, or package substrate die within the wafers. In addition, the method 1200 may include forming multiple openings in a ground layer of the wafer to expose board pads within the board dies.

At block 1208, the method 1200 may include placing a package on the redistribution layer. In some aspects, the method 1200 may include attaching each of the silicon dies to different package substrate dies using solder bumps to form packages. The method 1200 may also include forming each package to include multiple pads positioned relative to pins within the corresponding package substrates. The method 1200 may include placing the packages on the anisotropic polymer paste relative to the second sets of pads. The method 1200 may include placing the packages on the anisotropic polymer paste such that the pads are positioned relative the second sets of pads. In some aspects, the method 1200 may include placing multiple packages relative to a single redistribution layer.

In addition, the method 1200 may include bonding the package to the anisotropic polymer paste using thermal compression. In addition, the method 1200 may include bonding the redistribution layers and the packages to the anisotropic polymer paste using thermal compression. In some aspects, the method 1200 may include applying a temperature to the anisotropic polymer paste to cause the anisotropic polymer paste to become soft and adhere to the redistribution layers (e.g., the second sets of pads and a portion of the redistribution layers) and the packages (e.g., the pads and a portion of the package substrates). In these and other aspects, the method 1200 may include applying pressure to the packages to compress the anisotropic polymer paste between the packages and the redistribution layers while the anisotropic polymer paste is soft. The method 1200 may include applying the pressure to the packages to cause the pads to be within a particular physical proximity of the second sets of pads of the corresponding redistribution layers. The method 1200 may include applying the pressure to the packages such that the physical proximity of the pads to the second sets of pads of the corresponding redistribution layers may cause the pads to be electrically coupled to the second sets of pads.

At block 1210, the method 1200 may include curing the polymer in the oven. In some aspects, the method 1200 may include curing the anisotropic polymer paste to cause the anisotropic polymer paste to harden and maintain the physical proximity of the pads to the second sets of pads and the mechanical coupling between the packages and the redistribution layers.

At block 1212, the method 1200 may include dispensing an anisotropic polymer paste on a board. The method 1200 may include dispensing the anisotropic polymer paste on the board dies relative to the board pads. The anisotropic polymer paste may correspond to the anisotropic layer 323b described elsewhere in the present disclosure.

At block 1214, the method 1200 may include placing a package with thermal compression bonding. The method 1200 may include placing the packages including the corresponding redistribution layers on the anisotropic polymer paste relative to the board pads of the different board dies. The method 1200 may include placing the packages on the anisotropic polymer paste such that the pads are positioned relative the board pads within the corresponding board dies.

The method 1200 may include bonding the package including the corresponding redistribution layer to the anisotropic polymer paste using thermal compression. In addition, the method 1200 may include bonding the board dies and the packages including the corresponding redistribution layers to the anisotropic polymer paste using thermal compression. In some aspects, the method 1200 may include applying a temperature to the anisotropic polymer paste to cause the anisotropic polymer paste to become soft and adhere to the board dies and the packages (e.g., the pads and a portion of the package substrates). In these and other aspects, the method 1200 may include applying pressure to the packages including the corresponding redistribution layers to compress the anisotropic polymer paste between the packages including the corresponding redistribution layer and the board dies while the anisotropic polymer paste is soft. The method 1200 may include applying the pressure to the packages including the corresponding redistribution layers to cause the third set of pads to be within a particular physical proximity of the board pads of the corresponding board dies. The method 1200 may include applying the pressure to the packages including the corresponding redistribution layers such that the physical proximity of the third set of pads to the board pads of the corresponding board dies may cause the third set of pads to be electrically coupled to the board pads.

At block 1216, the method 1200 may include curing the polymer in the oven. In some aspects, the method 1200 may include curing the anisotropic polymer paste to cause the anisotropic polymer paste to harden and maintain the physical proximity of the third sets of pads to the board pads of the corresponding board dies and the mechanical coupling between the packages including the corresponding redistribution layers and the board dies. The method 1200 may include fabricating the chip assemblies such that the chip assemblies route signals from the silicon dies to the boards via the solder bumps, the package substrate, the pads, the anisotropic polymer paste, the second sets of pads, the redistribution layer, the third sets of pads, and the anisotropic polymer paste. In addition, the method 1200 may include fabricating the chip assemblies such that the chip assemblies route signals from the boards to the silicon dies via the anisotropic polymer paste, the third sets of pads, the redistribution layer, the second sets of pads, the anisotropic polymer paste, the pads, the package substrates, and the solder bumps. In addition, the method 1200 may form the redistribution layer such that the redistribution layer provides signals to the board according to a pinout that is different than a pinout of package substrate. Further, the method 1200 may form the multi-chip device such that the multi-chip device route signals from the different package substrates to each other. For example, the method 1200 may include forming the multi-chip device such that one or more signals are routed from a first package substrate to a second package substrate using one or more bridge pads that are part of the second set of pads.

Modifications, additions, or omissions may be made to the method 1200 without departing from the scope of the present disclosure. For example, the processes of method 1200 may be implemented in differing order. Additionally or alternatively, two or more processes may be performed at the same time. Furthermore, the outlined processes and actions are only provided as examples, and some of the processes and actions may be optional, combined into fewer processes and actions, or expanded into additional processes and actions without detracting from the essence of the described aspects.

Figure 13:
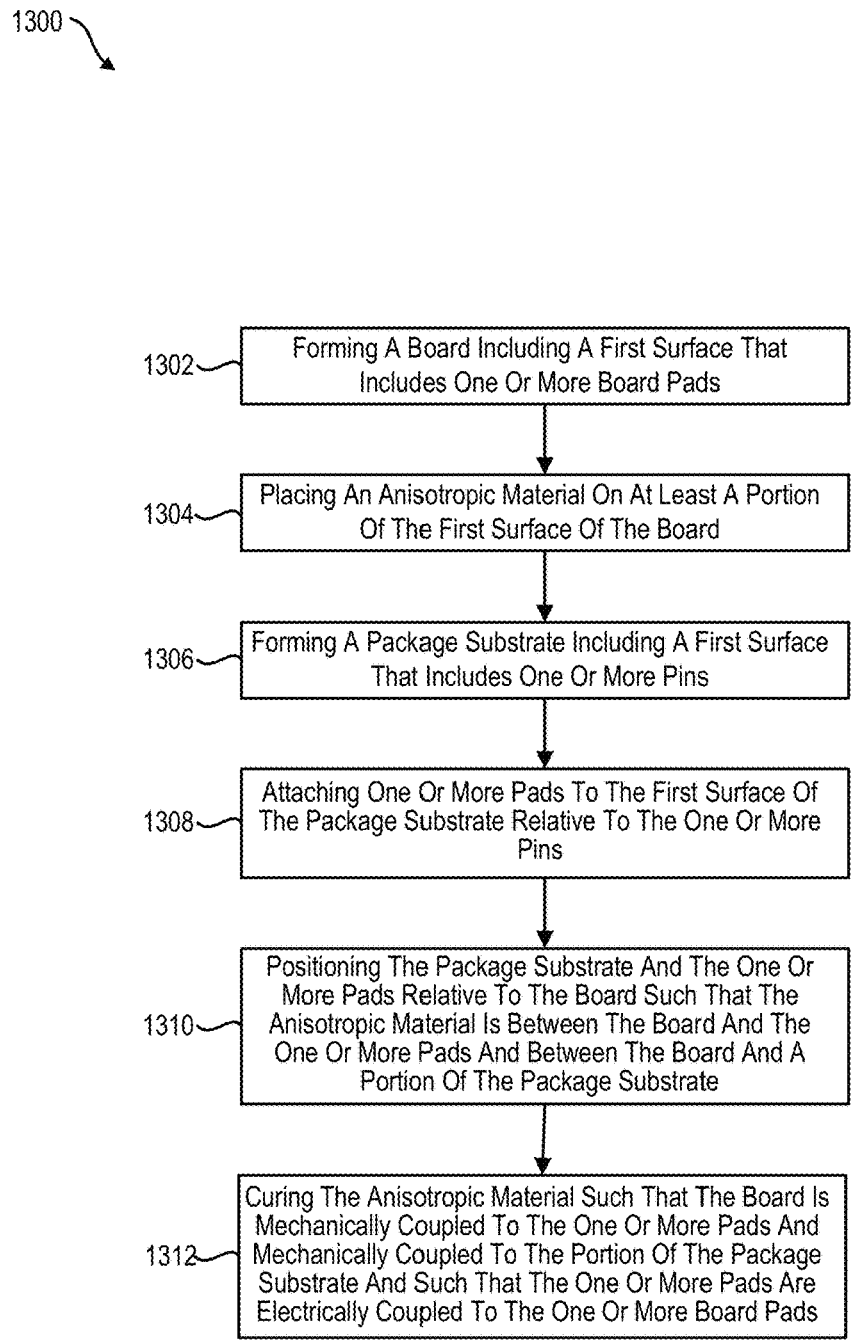
FIG. 13 illustrates an exemplary flowchart of a method of fabricating a chip assembly.

FIG. 13 illustrates an exemplary flowchart of a method 1300 of fabricating a chip assembly, in accordance with at least one aspect described in the present disclosure. The method 1300 may include forming a board including a first surface that includes one or more board pads 1302; placing an anisotropic material on at least a portion of the first surface of the board 1304; forming a package substrate including a first surface that includes one or more pins 1306; attaching one or more pads to the first surface of the package substrate relative to the one or more pins 1308; positioning the package substrate and the one or more pads relative to the board such that the anisotropic material is between the board and the one or more pads and between the board and a portion of the package substrate 1310; and curing the anisotropic material such that the board is mechanically coupled to the one or more pads and mechanically coupled to the portion of the package substrate and such that the one or more pads are electrically coupled to the one or more board pads 1312.

Figure 14:
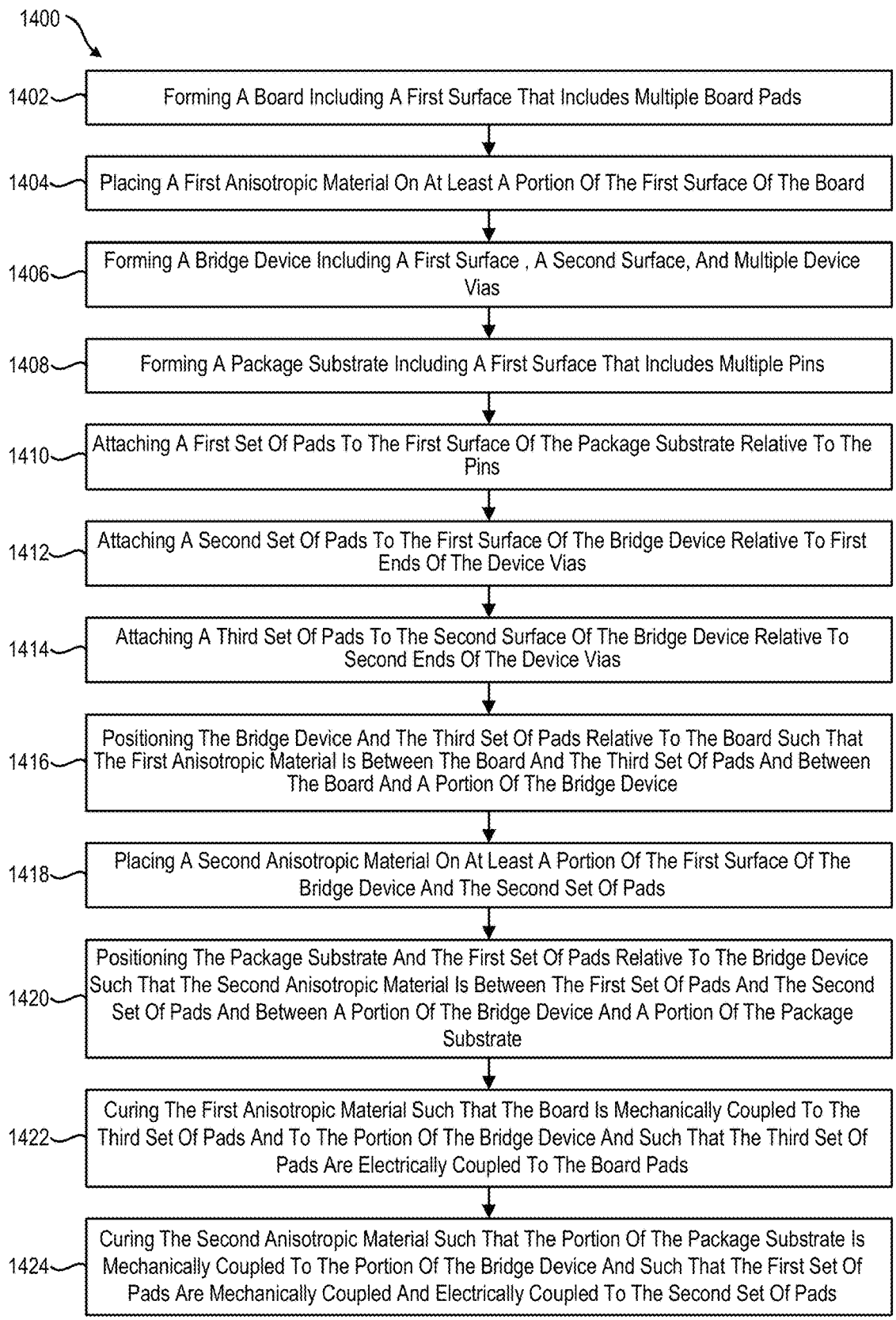
FIG. 14 illustrates another exemplary flowchart of a method of fabricating a chip assembly.

FIG. 14 illustrates an exemplary flowchart of a method 1400 of fabricating a chip assembly, in accordance with at least one aspect described in the present disclosure. The method 1400 may include forming a board including a first surface that includes multiple board pads 1402; placing a first anisotropic material on at least a portion of the first surface of the board 1404; forming a bridge device including a first surface, a second surface, and multiple device vias 1406; forming a package substrate including a first surface that includes multiple pins 1408; attaching a first set of pads to the first surface of the package substrate relative to the pins 1410; attaching a second set of pads to the first surface of the bridge device relative to first ends of the device vias 1412; attaching a third set of pads to the second surface of the bridge device relative to second ends of the device vias 1414; positioning the bridge device and the third set of pads relative to the board such that the first anisotropic material is between the board and the third set of pads and between the board and a portion of the bridge device 1416; placing a second anisotropic material on at least a portion of the first surface of the bridge device and the second set of pads 1418; positioning the package substrate and the first set of pads relative to the bridge device such that the second anisotropic material is between the first set of pads and the second set of pads and between a portion of the bridge device and a portion of the package substrate 1420; curing the first anisotropic material such that the board is mechanically coupled to the third set of pads and to the portion of the bridge device and such that the third set of pads are electrically coupled to the board pads 1422; and curing the second anisotropic material such that the portion of the package substrate is mechanically coupled to the portion of the bridge device and such that the first set of pads are mechanically coupled and electrically coupled to the second set of pads 1424.

Some aspects described in the present disclosure may include a ball-less pad array and an anisotropic layer to electrically couple the package substrate to the board. A chip assembly may include a package substrate that includes multiple pins. The chip assembly may also include multiple pads. The pads may be electrically coupled to the pins of the package substrate. In addition, the chip assembly may include a board that includes multiple board pads. Further, the chip assembly may include the anisotropic layer positioned between the board and the pads. The anisotropic layer may also be positioned between the board and a portion of the package substrate. In some aspects, the anisotropic layer may be formed using an anisotropic polymer paste. In some aspects, the anisotropic layer may mechanically couple the board to the pads. In these and other aspects, the anisotropic layer may mechanically couple the board to the portion of the package substrate. In addition, the anisotropic layer may electrically couple the pads to the board pads.

In some aspects, the pads may include a high density ball-less pad array to provide a compact interconnection from the package substrate to the board. In these and other aspects, the pad array and the anisotropic layer may replace a BGA within the chip assembly. The pad array may be deployed to both the package substrate and the board. In some aspects, the anisotropic layer (e.g., the anisotropic conductive material) may bond the pads, the package substrate, and a PCB substrate (e.g., the board) together. In some aspects, the anisotropic layer may provide a strong adhesive bond between package substrate and the board without using solder balls.

In some aspects, the anisotropic layer may electrically couple each pad to a different board pad within the board. In other aspects, the anisotropic layer may electrically couple the pads to the board pads by maintaining a physical proximity of the pads relative the board pads.

The package substrate may include a package ground layer. The package ground layer may include a package solder resist layer.

In some aspects, the board may include a board ground layer. The board ground layer may define multiple openings that expose the board pads. In addition, a portion of the pins in the package substrate may include power pins. In these and other aspects, each pad electrically coupled to the power pins may be positioned relative to a single opening defined by the ground layer. For example, the power pins may be grouped together and electrically coupled to a power pad as a plane to have a stronger connection between the package substrate and the board.

In some aspects, a portion of the pins in the package substrate may include signal pins. Each of the signal pins may be electrically coupled to a different pad. In addition, each pad electrically coupled to the signal pins may be positioned relative to different openings. The pads electrically coupled to the signal pins may be positioned relative to different openings. The board ground layer may shield each corresponding pad (e.g., each signal pad) from each.

In some aspects, a portion of the pins in the package substrate may include power pins. Another portion of the pads (e.g., a portion besides the pads electrically coupled to the signal pins) may be electrically coupled to the power pins. The portion of the pads electrically coupled to the power pins may be positioned relative to a single opening defined by the board ground layer. In these and other aspects, the board ground layer may shield the pads electrically coupled to the signal pins from the pads electrically coupled to the power pins.

In some aspects, a portion of the pins in the package substrate may include sets of differential signal pins (e.g., a first set of differential signal pins and a second set of differential signal pins). Each pin of the different sets of differential signal pins may be electrically coupled to a different pad (e.g., differential signal pads). Each set of differential signal pads may be positioned relative to a different opening. For example, a first set of differential signal pads may be positioned relative to a first opening and the second set of differential signal pads may be positioned relative to a second opening. The sets of differential signals pads may be positioned relative to different openings to shield the sets of differential signal pads from each other.

In some aspects, the chip assembly may include pads that include a size that is smaller than a ball size of a solder balls. In these and other aspects, the chip assembly may include pads that include a pitch size that is smaller than a ball pitch of the solder balls. Further, the package substrate may include traces and the pads may cause a length of one or more of the traces to be reduced compared to chip assemblies that include solder balls. In addition, the board may include traces and the pads may cause a length of one or more of the traces to be reduced compared to chip assemblies that include solder balls.

In some aspects, the size of the pads may include less than or equal to one millimeter.

In some aspects, the chip assembly may also include a silicon die. The chip assembly may also include solder bumps. The silicon die may be mechanically coupled and electrically coupled to the package substrate via the solder bumps.

In some aspects, a chip assembly may include a package substrate that includes multiple pins. The package substrate may be configured to provide signals via the pins according to a first pinout. The chip assembly may include a first set of pads that are electrically coupled to the pins. The chip assembly may also include a bridge device that includes multiple device vias. In addition, the chip assembly may include a second set of pads that are electrically coupled to first ends of the device vias. Further, the chip assembly may include an anisotropic layer (e.g., a first anisotropic layer) positioned between a portion of the bridge device and a portion of the package substrate. In addition, the anisotropic layer may be positioned between the first set of pads and the second set of pads. The anisotropic layer may mechanically couple the portion of the bridge device to the portion of the package substrate. The anisotropic layer may also mechanically couple the first set of pads to the second set of pads. The anisotropic layer may electrically couple the first set of pads to the second set of pads. The bridge device may be configured to provide the signals according to a second pinout that is different than the first pinout.

The chip assembly may include another anisotropic layer and a third set of pads. The third set of pads may be electrically coupled to the second ends of the device vias. The chip assembly may also include a board that includes multiple board pads. The other anisotropic layer (e.g., the second anisotropic layer) may be positioned between the board and the third set of pads. In addition, the other anisotropic layer may be positioned between the third set of pads and a portion of the bridge device. The other anisotropic layer may mechanically couple the board to the third set of pads and to the portion of the bridge device. The other anisotropic layer may also electrically couple the third set of pads to the board pads.

In some aspects, a chip assembly may include a high density ball-less second level interconnect (SLI) between the package substrate and the board. The SLI may provide an additional RDL for routing or re-distributing the signals to fit a particular pinout. The top pads of the SLI may bond to the package substrate and the bottom pads of the SLI may bond to the PCB substrate (e.g., the board) through the anisotropic conductive material (e.g., anisotropic layer) to provide a strong adhesive bond without BGA balls. In some aspects, power pads, ground pads, or some combination thereof may be grouped together as planes differently between the top and bottom pads based on the different pinouts.

The first anisotropic layer may electrically couple each pad of the first set of pads to a different pad of the second set of pads. In addition, the first anisotropic layer may electrically couple the first set of pads to the second set of pads by maintaining a physical proximity of the first set of pads relative to the second set of pads.

The second anisotropic layer may electrically couple each pad of the third set of pads to a different pad of the board pads. In addition, the second anisotropic layer may electrically couple the third set of pads to the board pads by maintaining a physical proximity of the third set of pads relative to the board pads.

The package substrate may include a package solder resist layer.

In some aspects, a portion of the device vias may include power vias. The board may include a board ground layer that defines openings that expose the board pads. At least a portion of the third set of pads are electrically coupled to the power vias. In some aspects, the portion of the third set of pads may be positioned relative to a single opening defined by the board ground layer. In some aspects, the board ground layer may include a solder resist layer.

A portion of the device vias may include signal vias. In addition, each signal via may be electrically coupled to a different pad of the third set of pads. Each pad of the third set of pads electrically coupled to the signal vias may be positioned relative to different openings defined by the board ground layer to shield each pad of the third set of pads electrically coupled to the signal vias from each other.

In some aspects, another portion of the device vias may include power vias. In addition, at least another portion of the third set of pads may be electrically coupled to the power vias. The another portion of the third set of pads may be positioned relative to a single opening defined by the board ground layer. Further, each pad of the third set of pads electrically coupled to the signal vias may be shielded from the portion of the third set of pads electrically coupled to the power vias.

A portion of the device vias may include a first set of differential signal vias and a second set of differential signal vias. Each via of the first set of differential signal vias and each via of the second set of differential signal vias may be electrically coupled to a different pad of the third set of pads (e.g., a first set of differential signal pads and a second set of differential signal pads). The first set of differential pads may be positioned relative to a first opening and the second set of differential pads may be positioned relative to a second opening to shield the pads of the different differential signals from each other.

The package substrate may include traces. In some aspects, the first set of pads, the second set of pads, and the third set of pads may cause a length of one or more traces of the package substrate to be reduced relative to systems that implement solder balls. The board may include traces. In some aspects, the first set of pads, the second set of pads, and the third set of pads may cause a length of one or more traces of the board to be reduced relative to systems that implement solder balls.

A size of each pad of the first set of pads, the second set of pads, and the third set of pads may include less than or equal to one millimeter.

In some aspects, the bridge device may include a SLI bridge device.

In some aspects, the chip assembly may include another package substrate (e.g., a second package substrate) that includes pins. The second package substrate may be configured to provide the signals according to a second pinout. A portion of the first set of pads may be electrically coupled to the pins of the second package substrate. The bridge device may also include a multi-chip device. In addition, a portion of the of pins of the package substrate (e.g., the first package substrate) may be electrically coupled to the multi-chip device via a portion of the first set of pads and a portion of the second set of pads. A portion of the pins of the second package substrate may be electrically coupled to the multi-chip device via another portion of the first set of pads and another portion of the second set of pads. The multi-chip device may be configured to route signals between the second package substrate and the first package substrate. In addition, a portion of the first anisotropic layer may further be positioned between a portion of the multi-chip device, the first package substrate, and the second package substrate.

In some aspects, the chip assembly may include a discrete component physically positioned between the first package substrate and the second package substrate. In addition, the chip assembly may include a discrete pad electrically coupled to the discrete component. The first anisotropic layer may further be positioned between a portion of the multi-chip device and the discrete pad.

In some aspects, the ball-less SLI may be extended to enable a multi-chip module solution by placing multiple devices (e.g., packages) on top of the RDL and the RDL may operate as an interconnect between the packages. In these and other aspects, the multi-chip device may include an embedded multi-die interconnect bridge (EMIB) within the SLI. The EMIB may provide the SLI co-EMIB solution. The ball-less pad array and the SLI may include mix pad sizes that include micro-pad sizes being implemented at the EMIB. The micro-pad size may permit high IO density connections from packages to the EMIB. Further, discrete component may be placed on the ball-less SLI to enhance decoupling schemes.

Some aspects described in the present disclosure may reduce a pad count without adding a huge amount of dedicated individual ground pads. In addition, some aspects described in the present disclosure may reduce signal routing trace lengths within the package substrates and/or the boards due to a reduce package size. Reduced trace lengths may improve signal insertion loss performance of the package substrate and/or the board, which may be critical for high speed signal bandwidth.

Some aspects described in the present disclosure may include a pitch of the pad array equal to or greater than 0.5 mm which may reduce the package substrate trace lengths by fifty percent compared to chip assemblies that implement a BGA with one mm ball sizes. In some aspects, roughly a one decibel improvement may occur when a trace is reduced from thirty mm to fifteen mm.

Some aspects described in the present disclosure may provide adjacent ground return paths and shielding by grouping power pads and pad places compared to separated and costly ground balls approach.

Example 1 may include a chip assembly that includes: a package substrate including one or more pins; one or more pads, the one or more pads electrically coupled to the one or more pins; a board including one or more board pads; and an anisotropic layer positioned between the board and the one or more pads and between the board and a portion of the package substrate, the anisotropic layer mechanically coupling the board to the one or more pads and to the portion of the package substrate and electrically coupling the one or more pads to the one or more board pads.

Example 2 may include the chip assembly of example 1, wherein the anisotropic layer electrically couples each pad of the one or more pads to a different board pad of the one or more board pads.

Example 3 may include the chip assembly of example 1, wherein the anisotropic layer electrically couples the one or more pads to the one or more board pads by maintaining a physical proximity of the one or more pads relative to the one or more board pads.

Example 4 may include the chip assembly of any of examples 1-3, wherein the portion of the package substrate includes a package ground layer.

Example 5 may include the chip assembly of example 4, wherein the package ground layer includes a package solder resist layer.

Example 6 may include the chip assembly of any of examples 1-5, wherein a portion of the one or more pins includes one or more power pins and a portion of the board includes a board ground layer that defines one or more openings that expose the one or more board pads and wherein at least a portion of the one or more pads are electrically coupled to the one or more power pins and the portion of the one or more pads is positioned relative to a single opening of the one or more openings.

Example 7 may include the chip assembly of example 6, wherein the board ground layer includes a solder resist layer.

Example 8 may include the chip assembly of any of examples 1-5, wherein a portion of the one or more pins includes one or more signal pins and each signal pin of the one or more signal pins is coupled to a different pad of the one or more pads and a portion of the board includes a board ground layer that defines a plurality of openings that expose the one or more board pads and wherein each pad of the one or more pads that is electrically coupled to the one or more signal pins is positioned relative to different openings of the plurality of openings to shield each pad of the one or more pads that is electrically coupled to the one or more signal pins from each other by the board ground layer.

Example 9 may include the chip assembly of example 8, wherein another portion of the one or more pins includes one or more power pins and wherein at least another portion of the one or more pads are electrically coupled to the one or more power pins and is positioned relative to a single opening of the plurality of openings and wherein each pad of the one or more pads that is electrically coupled to the one or more signal pins is shielded from the portion of the one or more pads that are electrically coupled to the power pins by the board ground layer.

Example 10 may include the chip assembly of any of examples 1-5, wherein a portion of the one or more pins includes a first set of differential signal pins and a second set of differential signal pins and wherein each pin of the first set of differential signal pins and each pin of the second set of differential signal pins is electrically coupled to a different pad of the one or more pads and a portion of the board includes a board ground layer that defines a plurality of openings that expose the one or more board pads and wherein the first set of differential pins is positioned relative to a first opening of the plurality of openings and the second set of differential pins is positioned relative to a second opening of the plurality of openings to shield the pads of the one or more pads electrically coupled to the first set of differential pins from the pads of the one or more pads electrically coupled to the second set of differential pins by the board ground layer.

Example 11 may include the chip assembly of any of examples 1-10, wherein a size of each pad of the one or more pads is smaller relative to a ball size of a solder ball.

Example 12 may include the chip assembly of any of examples 1-11, wherein a pitch of the one or more pads is smaller relative to a ball pitch of a plurality of solder balls.

Example 13 may include the chip assembly of any of examples 1-12, wherein the package substrate includes one or more traces and the one or more pads cause a length of one or more of the traces to be reduced relative to chip assemblies that implement solder balls.

Example 14 may include the chip assembly of any of examples 1-13, wherein a size of each pad of the one or more pads is less than one millimeter.

Example 15 may include the chip assembly of any of examples 1-14 further including a silicon die and a plurality of solder bumps, wherein the silicon die is electrically coupled to the package substrate via the plurality of solder bumps.

Example 16 may include a chip assembly that includes: a package substrate including a plurality of pins, the package substrate configured to provide one or more signals via the plurality of pins according to a first pinout; a first plurality of pads electrically coupled to the plurality of pins; a bridge device including a plurality of device vias; a second plurality of pads, the second plurality of pads electrically coupled to first ends of the plurality of device vias; and an anisotropic layer positioned between a portion of the bridge device and a portion of the package substrate and between the first plurality of pads and the second plurality of pads, wherein: the anisotropic layer mechanically couples the portion of the bridge device to the portion of the package substrate and the first plurality of pads to the second plurality of pads; the anisotropic layer electrically couples the first plurality of pads to the second plurality of pads; and the bridge device is configured provide the one or more signals via second ends of the plurality of device vias according to a second pinout that is different than the first pinout.

Example 17 may include the chip assembly of example 16, wherein the anisotropic layer includes a first anisotropic layer, the chip assembly further including: a third plurality of pads, the third plurality of pads electrically coupled to the second ends of the plurality of device vias; a board including a plurality of board pads; and a second anisotropic layer positioned between the board and the third plurality of pads and a portion of the bridge device, the second anisotropic layer mechanically coupling the board to the third plurality of pads and to the portion of the bridge device and electrically coupling the third plurality of pads to the plurality of board pads.

Example 18 may include the chip assembly of any of examples 16 and 17, wherein the first anisotropic layer electrically couples each pad of the first plurality of pads to a different pad of the second plurality of pads.

Example 19 may include the chip assembly of any of examples 16-18, wherein the first anisotropic layer electrically couples the first plurality of pads to the second plurality of pads by maintaining a physical proximity of the first plurality of pads relative to the second plurality of pads.

Example 20 may include the chip assembly of any of examples 17-19, wherein the second anisotropic layer electrically couples each pad of the third plurality of pads to a different pad of the plurality of board pads.

Example 21 may include the chip assembly of any of examples 17-20, wherein the second anisotropic layer electrically couples the third plurality of pads to the plurality of board pads by maintaining a physical proximity of the third plurality of pads relative to the plurality of board pads.

Example 22 may include the chip assembly of any of examples 16-21, wherein the portion of the package substrate includes a package solder resist layer.

Example 23 may include the chip assembly of any of examples 17-22, wherein a portion of the plurality of device vias include one or more power vias and a portion of the board includes a board ground layer that defines a plurality of openings that expose the plurality of board pads and wherein at least a portion of the third plurality of pads are electrically coupled to the one or more power vias and the portion of the third plurality of pads is positioned relative to a single opening of the plurality of openings.

Example 24 may include the chip assembly of example 23, wherein the board ground layer includes a solder resist layer.

Example 25 may include the chip assembly of any of examples 17-22, wherein a portion of the plurality of device vias includes one or more signal vias and each signal via of the one or more signal vias is coupled to a different pad of the third plurality of pads and a portion of the board includes a board ground layer that defines a plurality of openings that expose the plurality of board pads and wherein each pad of the third plurality of pads that is electrically coupled to the one or more signal vias is positioned relative to different openings of the plurality of openings to shield each pad of the third plurality of pads that is electrically coupled to the one or more signal vias from each other by the board ground layer.

Example 26 may include the chip assembly of example 25, wherein another portion of the plurality of device vias includes one or more power vias and wherein at least another portion of the third plurality of pads are electrically coupled to the one or more power vias and is positioned relative to a single opening of the plurality of openings and wherein each pad of the third plurality of pads that is electrically coupled to the one or more signal via is shielded from the portion of the third plurality of pads that is electrically coupled to the power vias by the board ground layer.

Example 27 may include the chip assembly of any of examples 17-22, wherein a portion of the plurality of device vias includes a first set of differential signal vias and a second set of differential signal vias and wherein each via of the first set of differential signal vias and each via of the second set of differential signal vias is electrically coupled to a different pad of the third plurality of pads and a portion of the board includes a board ground layer that defines a plurality of openings that expose the plurality of board pads and wherein the first set of differential vias is positioned relative to a first opening of the plurality of openings and the second set of differential vias is positioned relative to a second opening of the plurality of openings to shield the pads of the third plurality of pads electrically coupled to the first set of differential vias from the pads of the third plurality of pads electrically coupled to the second set of differential vias by the board ground layer.

Example 28 may include the chip assembly of any of examples 16-27, wherein a size of each pad of the first plurality of pads, the second plurality of pads, and the third plurality of pads is smaller relative to a ball size of a solder ball.

Example 29 may include the chip assembly of any of examples 16-28, wherein a pitch of each of the first plurality of pads, the second plurality of pads, and the third plurality of pads is smaller relative to a ball pitch of a plurality of solder balls.

Example 30 may include the chip assembly of any of examples 16-29, wherein the package substrate includes a plurality of traces and the first plurality of pads, the second plurality of pads, and the third plurality of pads cause a length of one or more traces of the plurality of traces to be reduced relative to systems that implement solder balls.

Example 31 may include the chip assembly of any of examples 16-30, wherein a size of each pad of the first plurality of pads, the second plurality of pads, and the third plurality of pads is less than one millimeter.

Example 32 may include the chip assembly of any of examples 16-31 further including a silicon die and a plurality of solder bumps, wherein the silicon die is electrically coupled to the package substrate via the plurality of solder bumps.

Example 33 may include the chip assembly of any of examples 16-32, wherein the bridge device includes a second level interconnect (SLI) bridge device.

Example 34 may include the chip assembly of example 17 wherein the package substrate includes a first package substrate, the chip assembly further including a second package substrate including a plurality of pins, the second package substrate configured to provide one or more signals via the plurality of pins according to a second pinout, wherein: a portion of the first plurality of pads are electrically coupled to the plurality of pins of the second package substrate; the bridge device further includes a multi-chip device, wherein: a portion of the plurality of pins of the first package substrate is electrically coupled to the multi-chip device via a portion of the first plurality of pads and a portion of the second plurality of pads; a portion of the plurality of pins of the second package substrate is electrically coupled to the multi-chip device via another portion of the first plurality of pads and another portion of the second plurality of pads; and the multi-chip device is configured to route one or more signals of the second package substrate to the first package substrate and one or more signals of the first package substrate to the second package substrate; and the first anisotropic layer is further positioned between a portion of the multi-chip device, the first package substrate, and the second package substrate.

Example 35 may include the chip assembly of example 34 further including: a discrete component physically positioned between the first package substrate and the second package substrate; and a discrete pad electrically coupled to the discrete component, wherein the first anisotropic layer is further positioned between a portion of the multi-chip device and the discrete pad.

Example 36 may include a method including: forming a board including a first surface that includes one or more board pads; placing an anisotropic material on at least a portion of the first surface of the board; forming a package substrate including a first surface that includes one or more pins; attaching one or more pads to the first surface of the package substrate relative to the one or more pins; positioning the package substrate and the one or more pads relative to the board such that the anisotropic material is between the board and the one or more pads and between the board and a portion of the package substrate; and curing the anisotropic material such that the board is mechanically coupled to the one or more pads and mechanically coupled to the portion of the package substrate and such that the one or more pads are electrically coupled to the one or more board pads.

Example 37 may include the method of example 36, wherein the package substrate and the one or more pads are positioned such that the anisotropic layer electrically couples each pad of the one or more pads to a different board pad of the one or more board pads.

Example 38 may include the method of any of examples 36 and 37 further including applying pressure to the package substrate such that the anisotropic material is compressed between the board and the one or more pads and between the board and the portion of the package substrate.

Example 39 may include the method of any of examples 36-38, wherein the board is formed to include a board ground layer including the first surface of the board, the method further including forming one or more openings in the board ground layer to expose the one or more board pads and wherein the package substrate and the one or more pads are attached to the board such that the one or more pads are positioned proximate the one or more openings.

Example 40 may include the method of any of examples 36-39, wherein the package substrate includes a second surface positioned opposite the first surface, the method further including: forming a plurality of solder bumps on the second surface of the package substrate; positioning a silicon die relative the solder bumps; and curing the solder bumps such that the silicon die is mechanically coupled and electrically coupled to the package substrate.

Example 41 may include the method of any of examples 36-40, wherein the anisotropic material includes an anisotropic polymer paste.

Example 42 may include a method including: forming a board including a first surface that includes a plurality of board pads; placing a first anisotropic material on at least a portion of the first surface of the board; forming a bridge device including a first surface, a second surface, and a plurality of device vias; forming a package substrate including a first surface that includes a plurality of pins; attaching a first plurality of pads to the first surface of the package substrate relative to the plurality of pins; attaching a second plurality of pads to the first surface of the bridge device relative to first ends of the plurality of device vias; attaching a third plurality of pads to the second surface of the bridge device relative to second ends of the plurality of device vias; positioning the bridge device and the third plurality of pads relative to the board such that the first anisotropic material is between the board and the third plurality of pads and between the board and a portion of the bridge device; placing a second anisotropic material on at least a portion of the first surface of the bridge device and the second plurality of pads; positioning the package substrate and the first plurality of pads relative to the bridge device such that the second anisotropic material is between the first plurality of pads and the second plurality of pads and between a portion of the bridge device and a portion of the package substrate; curing the first anisotropic material such that the board is mechanically coupled to the third plurality of pads and to the portion of the bridge device and such that the third plurality of pads are electrically coupled to the plurality of board pads; and curing the second anisotropic material such that the portion of the package substrate is mechanically coupled to the portion of the bridge device and such that the first plurality of pads are mechanically coupled and electrically coupled to the second plurality of pads.

Example 43 may include the method of example 42, wherein the package substrate includes a first package substrate, the method further including: forming a second package substrate including a first surface that includes a plurality of pins; attaching a portion of the first plurality of pads to the first surface of the second package substrate relative to the plurality of pins of the second package substrate; forming a multi-chip device within a portion of the bridge device, wherein: a portion of the first plurality of pads is attached to the first package substrate relative to the multi-chip device; a portion of the first plurality of pad is attached to the second package substrate relative to the multi-chip device; and positioning the second package substrate and the portion of the first plurality of pads attached to the second package substrate relative to the bridge device and the multi-chip device such that the second anisotropic material is between a portion of the second package substrate and a portion of the bridge device and such that the portion of the first plurality of pads attached to the second package substrate are mechanically coupled and electrically coupled to the multi-chip device and the second plurality of pads.

The invention claimed is:

1. A chip assembly, comprising:
a package substrate comprising one or more pins;
one or more pads, the one or more pads electrically coupled to the one or more pins;
a board comprising one or more board pads; and
an anisotropic layer positioned between the board and the one or more pads and between the board and a portion of the package substrate, the anisotropic layer mechanically coupling the board to the one or more pads and to the portion of the package substrate and electrically coupling the one or more pads to the one or more board pads.

2. The chip assembly of claim 1, wherein the anisotropic layer comprises a conductive material that electrically couples the one or more pads to the one or more board pads, wherein the anisotropic layer separates the one or more pads from the one or more board pads by a fixed distance.

3. The chip assembly of claim 1, wherein a power pin grouping of the one or more pins comprises one or more power pins, wherein a portion of the board comprises a board ground layer that defines one or more openings that expose the one or more board pads, wherein a power pad grouping of the one or more pads is electrically coupled to the one or more power pins through a single opening of the one or more openings.

4. The chip assembly of claim 1, wherein a signal pin grouping of the one or more pins comprises one or more signal pins, wherein each signal pin of the one or more signal pins is coupled to a different pad of a signal pad grouping of the one or more pads, wherein a portion of the board comprises a board ground layer that defines a plurality of openings that expose the one or more board pads, wherein each pad of the signal pad grouping is electrically coupled to the different pad of the signal pad grouping through different openings of the plurality of openings for shielding, by the board ground layer, each pad of the signal pad grouping from each other pad of the signal pad grouping.

5. The chip assembly of claim 4, wherein a power pin grouping of the one or more pins comprises one or more power pins, wherein a power pad grouping of the one or more pads are electrically coupled to the one or more power pins through a single opening of the plurality of openings, wherein each pad of the signal pad grouping is shielded, by the board ground layer, from the power pad grouping.

6. The chip assembly of claim 1, wherein a differential signal pin grouping of the one or more pins comprises a first set of differential signal pins and a second set of differential signal pins, wherein each of the first set of differential signal pins is electrically coupled through a first opening to a different pad of a first differential pad grouping of the one or more pads, wherein each of the second set of differential signal pins is electrically coupled through a second opening to a different pad of a second differential pad grouping of the one or more pads, wherein a portion of the board comprises a board ground layer that defines the first and second openings and exposes the one or more board pads, wherein the first differential pad grouping is shielded, by the board ground layer, from the second differential pad grouping, wherein the first opening is different from the second opening.

7. A chip assembly, comprising:
a package substrate comprising a plurality of pins, the package substrate configured to provide one or more signals via the plurality of pins according to a first pinout;
a first plurality of pads electrically coupled to the plurality of pins;
a bridge device comprising a plurality of device vias;
a second plurality of pads, the second plurality of pads electrically coupled to first ends of the plurality of device vias; and
an anisotropic layer positioned between a portion of the bridge device and a portion of the package substrate and between the first plurality of pads and the second plurality of pads, wherein:
the anisotropic layer mechanically couples the portion of the bridge device to the portion of the package substrate and the first plurality of pads to the second plurality of pads;

the anisotropic layer electrically couples the first plurality of pads to the second plurality of pads; and the bridge device is configured provide the one or more signals via second ends of the plurality of device vias according to a second pinout that is different than the first pinout.

8. The chip assembly of claim 7, wherein the anisotropic layer comprises a first anisotropic layer, the chip assembly further comprising:

a third plurality of pads, the third plurality of pads electrically coupled to the second ends of the plurality of device vias;

a board comprising a plurality of board pads; and a second anisotropic layer positioned between the board and the third plurality of pads and a portion of the bridge device, the second anisotropic layer mechanically coupling the board to the third plurality of pads and to the portion of the bridge device and electrically coupling the third plurality of pads to the plurality of board pads.

9. The chip assembly of claim 7, wherein the first anisotropic layer electrically couples the first plurality of pads to the second plurality of pads, wherein the anisotropic layer separates the first plurality of pads from the second plurality of pads by a fixed distance.

10. The chip assembly of claim 8, wherein the second anisotropic layer electrically couples the third plurality of pads to the plurality of board pads, wherein the anisotropic layer separates the third plurality of pads from the plurality of board pads by a fixed distance.

11. The chip assembly of claim 8, wherein a power via grouping of the plurality of device vias comprises one or more power vias, wherein a portion of the board comprises a board ground layer that defines a plurality of openings that expose the plurality of board pads, wherein at least a via pad grouping of the third plurality of pads are electrically coupled to the one or more power vias through a single opening of the plurality of openings.

12. The chip assembly of claim 8, wherein a signal via grouping of the plurality of device vias comprises one or more signal vias, wherein each signal via of the one or more signal vias is coupled, via different openings, to a different pad of signal pad grouping of the third plurality of pads, wherein a portion of the board comprises a board ground layer that defines the different openings that expose the plurality of board pads and shield, by the board ground layer, each pad of the signal pad grouping from each other pad of the signal pad grouping.

13. The chip assembly of claim 12, wherein a power via grouping of the plurality of device vias comprises one or more power vias, wherein a or power pad grouping of the third plurality of pads are electrically coupled to the one or more power vias through a single opening of the different openings, wherein each pad of the signal pad grouping is shielded, by the board ground layer, from the power pad grouping.

14. The chip assembly of claim 8, wherein a differential via grouping of the plurality of device vias comprises a first set of differential signal vias and a second set of differential signal vias, wherein each of the first set of differential signal vias is electrically coupled to through a first opening to a different pad of a first differential pad grouping of the third plurality of pads, wherein each of the second set of differential signal vias is electrically coupled through a second opening to a different pad of a second differential via pad grouping of the third plurality of pads, wherein a portion of the board comprises a board ground layer that defines the first and second openings and exposes the plurality of board pads, wherein the first differential pad grouping is shielded, by the board ground layer, from the second differential pad grouping, wherein the first opening is different from the second opening.

15. The chip assembly of claim 8, wherein the package substrate comprises a first package substrate, the chip assembly further comprising a second package substrate comprising a plurality of pins, the second package substrate configured to provide one or more signals via the plurality of pins according to a second pinout, wherein:

a portion of the first plurality of pads are electrically coupled to the plurality of pins of the second package substrate;

the bridge device further comprises a multi-chip device, wherein:

a portion of the plurality of pins of the first package substrate is electrically coupled to the multi-chip device via a portion of the first plurality of pads and a portion of the second plurality of pads;

a portion of the plurality of pins of the second package substrate is electrically coupled to the multi-chip device via another portion of the first plurality of pads and another portion of the second plurality of pads; and the multi-chip device is configured to route one or more signals of the second package substrate to the first package substrate and one or more signals of the first package substrate to the second package substrate; and the first anisotropic layer is further positioned between a portion of the multi-chip device, the first package substrate, and the second package substrate.

16. A method comprising:

forming a board comprising a first surface that comprises one or more board pads;

placing an anisotropic material on at least a portion of the first surface of the board;

forming a package substrate comprising a first surface that comprises one or more pins;

attaching one or more pads to the first surface of the package substrate relative to the one or more pins;

positioning the package substrate and the one or more pads relative to the board such that the anisotropic material is between the board and the one or more pads and between the board and a portion of the package substrate; and curing the anisotropic material such that the board is mechanically coupled to the one or more pads and mechanically coupled to the portion of the package substrate and such that the one or more pads are electrically coupled to the one or more board pads.

17. The method of claim 16, wherein the package substrate and the one or more pads are positioned such that the anisotropic layer electrically couples each pad of the one or more pads to a different board pad of the one or more board pads.

18. The method of claim 16 further comprising applying pressure to the package substrate such that the anisotropic material is compressed between the board and the one or more pads and between the board and the portion of the package substrate.

19. The method of claim 16, wherein the board is formed to comprise a board ground layer comprising the first surface of the board, the method further comprising forming one or more openings in the board ground layer to expose the one or more board pads and wherein the package substrate and the one or more pads are attached to the board such that the one or more pads are positioned proximate the one or more openings.

20. The method of claim 16, wherein the package substrate comprises a second surface positioned opposite the first surface, the method further comprising:
- forming a plurality of solder bumps on the second surface of the package substrate;
- positioning a silicon die relative to the solder bumps; and
- curing the solder bumps such that the silicon die is mechanically coupled and electrically coupled to the package substrate.

\* \* \* \* \*